United States Patent
Tomizawa et al.

(10) Patent No.: US 10,475,855 B2
(45) Date of Patent: Nov. 12, 2019

(54) DISPLAY DEVICE

(71) Applicants:Sharp Kabushiki Kaisha, Osaka-shi, Osaka (JP); National University Corporation Shizuoka University, Shizuoka-shi, Shizuoka (JP)

(72) Inventors: Kazunari Tomizawa, Osaka (JP); Akiko Satoh, Osaka (JP); Yoshifumi Shimodaira, Hamamatsu (JP); Gosuke Ohashi, Hamamatsu (JP); Yusuke Amano, Hamamatsu (JP)

(73) Assignees: SHARP KABUSHIKI KAISHA, Sakai (JP); NATIONAL UNIVERSITY CORPORATION SHIZUOKA UNIVERSITY, Shizuoka (JP)

( * ) Notice: Subject to any disclaimer, the term of this patent is extended or adjusted under 35 U.S.C. 154(b) by 621 days.

(21) Appl. No.: 14/910,455

(22) PCT Filed: Aug. 7, 2014

(86) PCT No.: PCT/JP2014/070838
§ 371 (c)(1),
(2) Date: Feb. 5, 2016

(87) PCT Pub. No.: WO2015/020137
PCT Pub. Date: Feb. 12, 2015

(65) Prior Publication Data
US 2016/0181329 A1  Jun. 23, 2016

(30) Foreign Application Priority Data
Aug. 8, 2013 (JP) .................................. 2013-165016

(51) Int. Cl.
*H01L 27/32* (2006.01)
*G02F 1/1335* (2006.01)

(52) U.S. Cl.
CPC ...... *H01L 27/3213* (2013.01); *H01L 27/3218* (2013.01); *G02F 1/133603* (2013.01); *G02F 1/133621* (2013.01); *G02F 2201/52* (2013.01)

(58) Field of Classification Search
CPC .............. H01L 27/312; H01L 27/3211; H01L 51/5036; H01L 51/5012; H01L 51/504
See application file for complete search history.

(56) References Cited

U.S. PATENT DOCUMENTS

| | | | |
|---|---|---|---|
| 2007/0076141 A1* | 4/2007 | Domoto | H01L 27/3211 349/69 |
| 2007/0085862 A1 | 4/2007 | Moriya et al. | |

(Continued)

FOREIGN PATENT DOCUMENTS

| | | |
|---|---|---|
| JP | 2001-185357 A | 7/2001 |
| JP | 2007-018902 A | 1/2007 |

(Continued)

OTHER PUBLICATIONS

Official Communication issued in International Patent Application No. PCT/JP2014/070838, dated Nov. 18, 2014.

*Primary Examiner* — Paisley L Wilson
*Assistant Examiner* — Mariam Qureshi
(74) *Attorney, Agent, or Firm* — Keating & Bennett, LLP

(57) ABSTRACT

A display device (100) includes a spontaneous light emission-type display panel (10). The display device includes a plurality of pixels (P). The plurality of pixels each include a plurality of sub pixels including a red sub pixel (R), a green sub pixel (G) and a blue sub pixel (B). The display panel includes a red light emitting element (1*r*), a green light emitting element (1*g*), and a blue light emitting element (1*b*). Red light, green light and blue light respectively emitted by the red light emitting element, the green light emitting element and the blue light emitting element each have a spectrum half width of 10 nm or less. The plurality (Continued)

of sub pixels included in each pixel further include a yellow sub pixel (Ye). The display panel further includes a yellow light emitting element (1y) provided in an area corresponding to the yellow sub pixel. The yellow light emitting element emits yellow light having a dominant wavelength of 550 nm or greater and 600 nm or less.

3 Claims, 25 Drawing Sheets

(56) References Cited

U.S. PATENT DOCUMENTS

| | | | |
|---|---|---|---|
| 2007/0109463 A1* | 5/2007 | Hutchins | G02F 1/133603 349/61 |
| 2008/0204366 A1* | 8/2008 | Kane | H05B 33/10 345/44 |
| 2009/0091238 A1 | 4/2009 | Cok et al. | |
| 2009/0212692 A1 | 8/2009 | Hasegawa | |
| 2010/0066956 A1* | 3/2010 | Nakamura | G02B 5/201 349/108 |
| 2010/0142189 A1* | 6/2010 | Hong | C09K 11/616 362/97.3 |
| 2011/0089453 A1* | 4/2011 | Min | F21V 5/04 257/98 |
| 2012/0242217 A1* | 9/2012 | Matsumoto | H01L 27/3213 313/504 |
| 2012/0250351 A1* | 10/2012 | Shin | G02F 1/133603 362/608 |
| 2013/0020933 A1* | 1/2013 | Levermore | H01L 27/3213 313/504 |
| 2013/0113847 A1 | 5/2013 | Mori et al. | |
| 2014/0084269 A1* | 3/2014 | Weaver | H01L 27/3209 257/40 |
| 2014/0158982 A1* | 6/2014 | Park | G02B 6/005 257/13 |
| 2014/0265928 A1* | 9/2014 | Wagner | G09G 3/3413 315/297 |
| 2015/0062963 A1* | 3/2015 | Meir | G02B 6/005 362/607 |
| 2016/0254473 A1* | 9/2016 | Liu | H01L 51/0003 438/23 |

FOREIGN PATENT DOCUMENTS

| | | |
|---|---|---|
| JP | 2007-140456 A | 6/2007 |
| JP | 2009-231274 A | 10/2009 |
| JP | 2010-541180 A | 12/2010 |
| WO | 2008/114695 A1 | 9/2008 |
| WO | 2012/005022 A1 | 1/2012 |

* cited by examiner

EMBODIMENT 4: SPECTRA OF PRIMARY COLORS

DISPLAY DEVICE

TECHNICAL FIELD

The present invention relates to a display device, and specifically to a display device suitable to broaden a color range.

BACKGROUND ART

Recently, display devices are desired to have a broader color range (to have an expanded color reproduction range).

Spontaneous light emission-type display devices such as organic EL (electroluminescence) display devices or the like allow the color reproduction range to be expanded by, for example, narrowing the spectral bands of the three primary colors used for display, namely, red, green and blue. For liquid crystal display devices that are not of a spontaneous light emission type, a technology of expanding the color reproduction range by using four or more primary colors for display (using a multi-primary color system) (e.g., Patent Document 1).

CITATION LIST

Patent Literature

Patent Document 1: International Publication WO2012/005022

SUMMARY OF INVENTION

Technical Problem

However, when the half width of the spectra of the three primary colors (red, green and blue) in order to broaden a color range, discrepancy regarding color measurement and sense of vision (individual difference) occurs for colors produced by additive mixture of the three primary colors (colors displayed by a display device). More specifically, one color displayed by a display device is perceived as different colors by a plurality of viewers due to individual difference on color-matching functions. The influence caused by such an individual difference tends to be larger as the half width of the spectrum of each of the three primary colors is narrower. Such a color variance caused by the individual difference on the color-matching functions also occurs in multi-primary color liquid crystal display devices.

The present invention made in light of the above-described problem has an object of providing a display device alleviating variance in a color perceived by viewers, which is caused by individual difference on color-matching functions.

Solution to Problem

A display device in an embodiment according to the present invention includes a spontaneous light emission-type display panel. The display device includes a plurality of pixels. The plurality of pixels each include a plurality of sub pixels including a red sub pixel, a green sub pixel and a blue sub pixel; the display panel includes a red light emitting element provided in an area corresponding to the red sub pixel, a green light emitting element provided in an area corresponding to the green sub pixel, and a blue light emitting element provided in an area corresponding to the blue sub pixel; red light, green light and blue light respectively emitted by the red light emitting element, the green light emitting element and the blue light emitting element each have a spectrum half width of 10 nm or less; the plurality of sub pixels further include a yellow sub pixel; and the display panel further includes a yellow light emitting element provided in an area corresponding to the yellow sub pixel, the yellow light emitting element emitting yellow light having a dominant wavelength of 550 nm or greater and 600 nm or less.

In an embodiment, yellow displayed by the yellow sub pixel has a chromaticity on a side of, or on the inside of, a triangle having, as apexes, chromaticities of red, green and blue displayed by the red sub pixel, the green sub pixel and the blue sub pixel on a chromaticity diagram.

A display device in an embodiment according to the present invention includes a spontaneous light emission-type display panel. The display device includes a plurality of pixels. The plurality of pixels each include a plurality of sub pixels including a red sub pixel, a green sub pixel and a blue sub pixel; the display panel includes a red light emitting element provided in an area corresponding to the red sub pixel, a green light emitting element provided in an area corresponding to the green sub pixel, and a blue light emitting element provided in an area corresponding to the blue sub pixel; and blue light emitted by the blue light emitting element does not substantially include a component having a wavelength exceeding 525 nm and has a spectrum half width exceeding 20 nm.

A display device in an embodiment according to the present invention includes a spontaneous light emission-type display panel. The display device includes a plurality of pixels. The display panel includes a red light emitting element emitting red light, a green light emitting element emitting green light, and a first blue light emitting element and a second blue light emitting element emitting blue light of different spectra from each other.

In an embodiment, the plurality of pixels each include a plurality of sub pixels including a red sub pixel, a green sub pixel and a blue sub pixel; and the first blue light emitting element and the second blue light emitting element are provided in an area corresponding to the blue sub pixel in the display panel.

In an embodiment, the plurality of pixels each include a plurality of sub pixels including a red sub pixel, a green sub pixel and a blue sub pixel; and the plurality of pixels include a pixel in which the first blue light emitting element is provided but the second blue light emitting element is not provided in an area corresponding to the blue sub pixel in the display panel, and also include a pixel in which the second blue light emitting element is provided but the first blue light emitting element is not provided in the area corresponding to the blue sub pixel in the display panel.

In an embodiment, the plurality of sub pixels further include a yellow sub pixel; and the display panel further includes a yellow light emitting element provided in an area corresponding to the yellow sub pixel, the yellow light emitting element emitting yellow light having a dominant wavelength of 550 nm or greater and 600 nm or less.

In an embodiment, red light and green light respectively emitted by the red light emitting element and the green light emitting element each have a spectrum half width of 30 nm or less.

In an embodiment, red light and green light respectively emitted by the red light emitting element and the green light emitting element each have a spectrum half width of 10 nm or less.

A display device in an embodiment according to the present invention includes a liquid crystal display panel including a liquid crystal layer; and an illumination device irradiating the liquid crystal display panel with light. The display device includes a plurality of pixels. The illumination device includes a red light source emitting red light, a green light source emitting green light, and a blue light source emitting blue light; the plurality of pixels each include a plurality of sub pixels including a red sub pixel, a green sub pixel, a blue sub pixel and a yellow sub pixel; and the illumination device further includes a yellow light source emitting yellow light having a dominant wavelength of 550 nm or greater and 600 nm or less.

Advantageous Effects of Invention

Embodiments according to the present invention provide a display device alleviating variance in a color perceived by viewers, which is caused by individual difference on color-matching functions.

BRIEF DESCRIPTION OF DRAWINGS

FIG. 4(a) shows X(λ), FIG. 4(b) shows Y(λ), and FIG. 4(c) shows Z(λ).

FIG. 5(a) shows X(λ), FIG. 5(b) shows Y(λ), and FIG. 5(c) shows Z(λ).

FIG. 6(a) shows X(λ), FIG. 6(b) shows Y(λ), and FIG. 6(c) shows Z(λ).

DESCRIPTION OF EMBODIMENTS

Hereinafter, embodiments of the present invention will be described with reference to the drawings. The present invention is not limited to any of the following embodiments.

(Embodiment 1)

Figure 1:
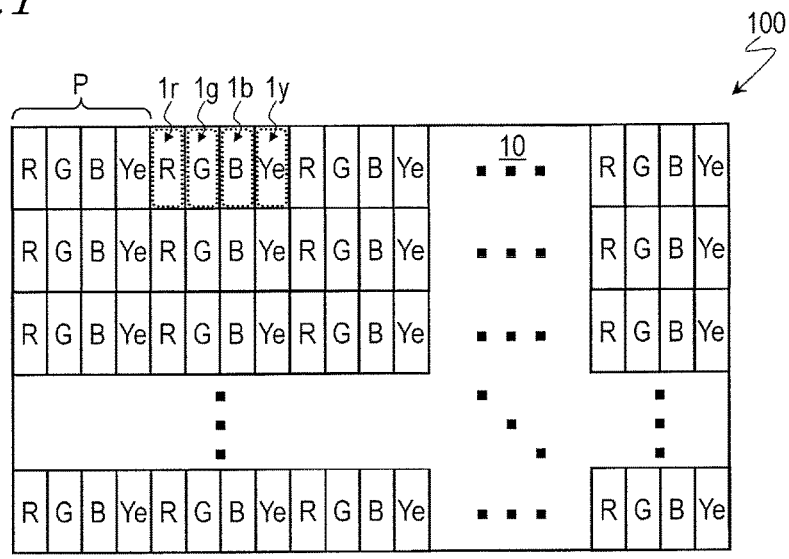
FIG. 1 is a plan view schematically showing a display device 100 in an embodiment according to the present invention.

FIG. 1 shows a display device 100 in this embodiment. FIG. 1 is a plan view schematically showing the display device 100.

As shown in FIG. 1, the display device 100 includes a spontaneous light emission-type display panel 10. The display device 100 includes a plurality of pixels P.

The plurality of pixels P are arrayed in a matrix including rows and columns. The plurality of pixels P each include a plurality of sub pixels including a red sub pixel R, a green sub pixel G and a blue sub pixel B.

The display panel 10 includes a red light emitting element 1r provided in an area corresponding to the red sub pixel R, a green light emitting element 1g provided in an area corresponding to the green sub pixel G, and a blue light emitting element 1b provided in an area corresponding to the blue sub pixel B. The red light emitting element 1r, the green light emitting element 1g and the blue light emitting element 1b are each, for example, an organic EL element. Needless to say, each of the red light emitting element 1r, the green light emitting element 1g and the blue light emitting element 1b is not limited to being an organic EL element, and may be any of various known spontaneous light emission-type elements (e.g., inorganic EL element).

Figure 2:
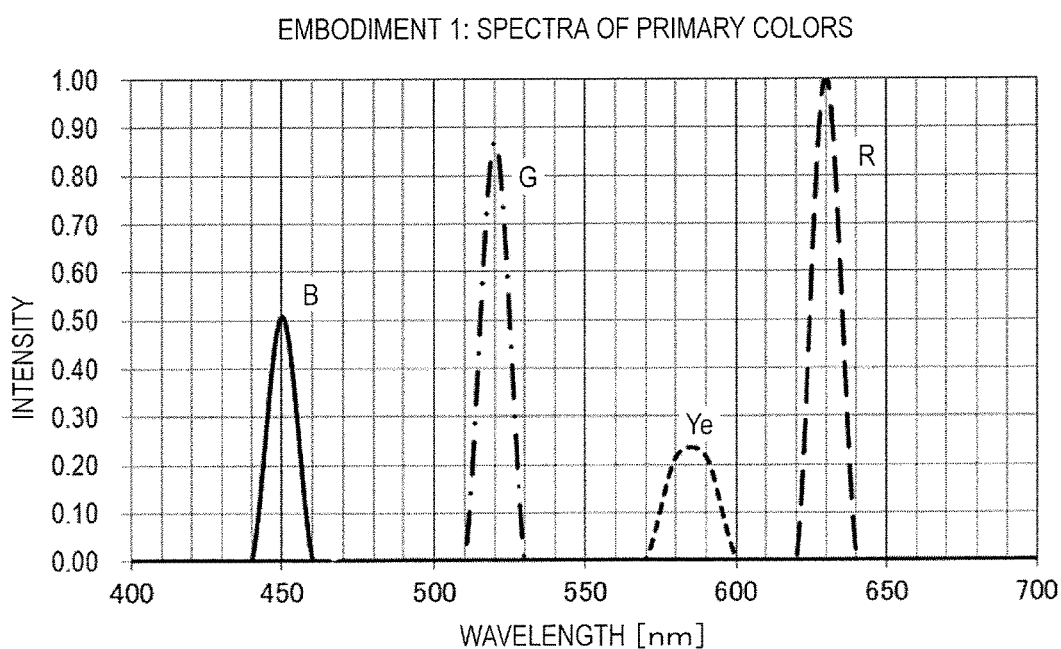
FIG. 2 is a graph showing spectra of red light, green light, blue light and yellow light respectively emitted by a red light emitting element 1r, a green light emitting element 1g, a blue light emitting element 1b and a yellow light emitting element 1y in the display device 100.

As shown in FIG. 2, in the display device 100 in this embodiment, red light, green light and blue light respectively emitted by the red light emitting element 1r, the green light emitting element 1g and the blue light emitting element 1b each have a spectrum half width (full width at half maximum) of 10 nm or less. As shown in FIG. 1, the plurality of sub pixels included in each pixel P further include a yellow sub pixel Ye. The display panel 10 further includes a yellow light emitting element 1y provided in an area corresponding to the yellow sub pixel Ye. Yellow light emitted by the yellow sub pixel Ye has a dominant wavelength of 550 nm or greater and 600 nm or less. The yellow light emitting element 1y is, for example, an organic EL element. Needless to say, the yellow light emitting element 1y is not limited to being an organic EL element, and may be any of various known spontaneous light emission-type elements (e.g., inorganic EL element).

As described above, in this embodiment, red light, green light and blue light respectively emitted by the red light emitting element 1r, the green light emitting element 1g and the blue light emitting element 1b each have a spectrum half width of 10 nm or less, which is narrower than that of a common spontaneous light emission-type display device. Therefore, the display device 100 in this embodiment has a broad color reproduction range.

In the display device 100 in this embodiment, the display panel 10 includes the yellow light emitting element 1y emitting yellow light having a dominant wavelength of 550 nm or greater and 600 nm or less (namely, the plurality of sub pixels included in each pixel P include the yellow sub pixel Ye). Therefore, the variance in a color perceived by viewers is alleviated. Hereinafter, a reason for this will be described in detail.

Figure 3:
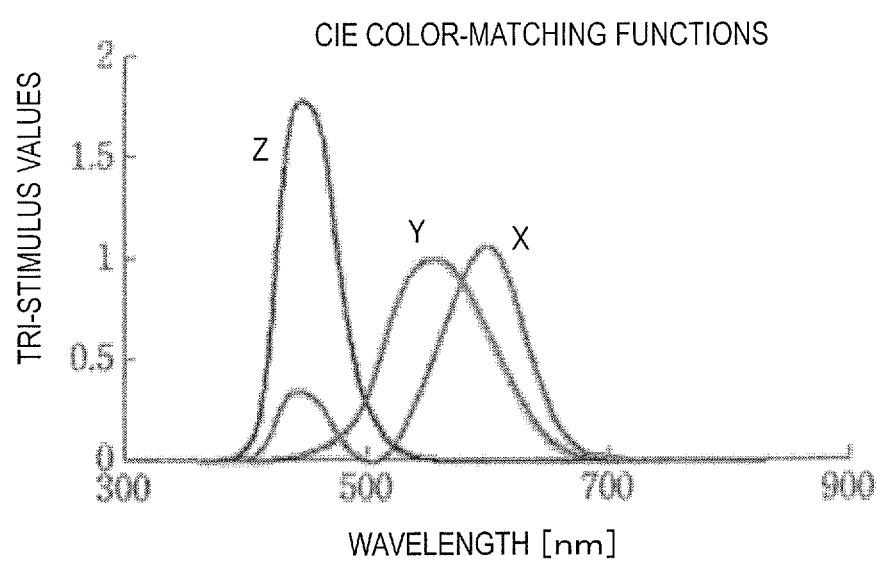
FIG. 3 is a graph showing the CIE color-matching functions.

FIG. 3 is a graph showing the color-matching functions $X(\lambda)$, $Y(\lambda)$ and $Z(\lambda)$ of the XYZ colorimetric system defined by CIE (International Commission on Illumination). The CIE color-matching functions shown in FIG. 3 are each found from an average value of subjects of a color-matching experiment at the time when the color-matching functions were formulated. There is inherently an individual difference on the color-matching functions. Therefore, when a plurality of viewers view a display device that displays a certain color, the colors perceived by viewers may be different from each other although one, same color is displayed. As the spectral band of each of the three primary colors is narrower, the individual difference on the color-matching functions is larger.

The individual difference on the color-matching functions will be described in more detail with reference to FIG. 4.

Figure 4:
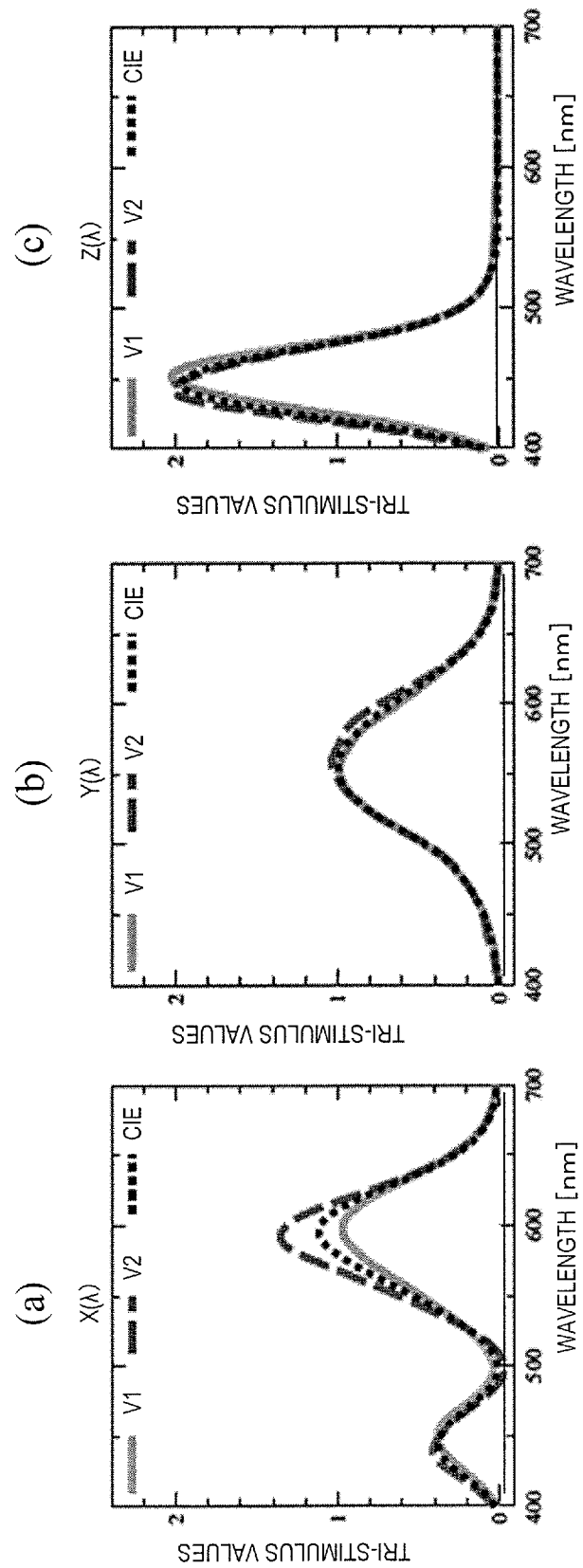
FIG. 4(a), FIG. 4(b) and FIG. 4(c) are each a graph showing the CIE color-matching function, the color-matching function of viewer V1 and the color-matching function of viewer V2.

FIG. 4(a), FIG. 4(b) and FIG. 4(c) show the CIE color-matching functions, the color-matching functions of viewer V1, and the color-matching functions of viewer V2. FIG. 4(*a*) shows X(λ), FIG. 4(*b*) shows Y(λ), and FIG. 4(*c*) shows Z(λ).

As shown in FIG. 4(*a*), FIG. 4(*b*) and FIG. 4(*c*), the CIE color-matching functions, the color-matching functions of viewer V1, and the color-matching functions of viewer V2 are different from each other. From this, it is seen that there is an individual difference on the color-matching functions.

From FIG. 4(*a*) and FIG. 4(*b*), it is seen that regarding the color-matching functions X(λ) and Y(λ), the individual difference is large in a wavelength range of about 550 nm to about 630 nm. From FIG. 4(*c*), it is seen that regarding the color-matching function Z(λ), the individual difference is large in a wavelength range of about 400 nm to about 500 nm.

Figure 5:
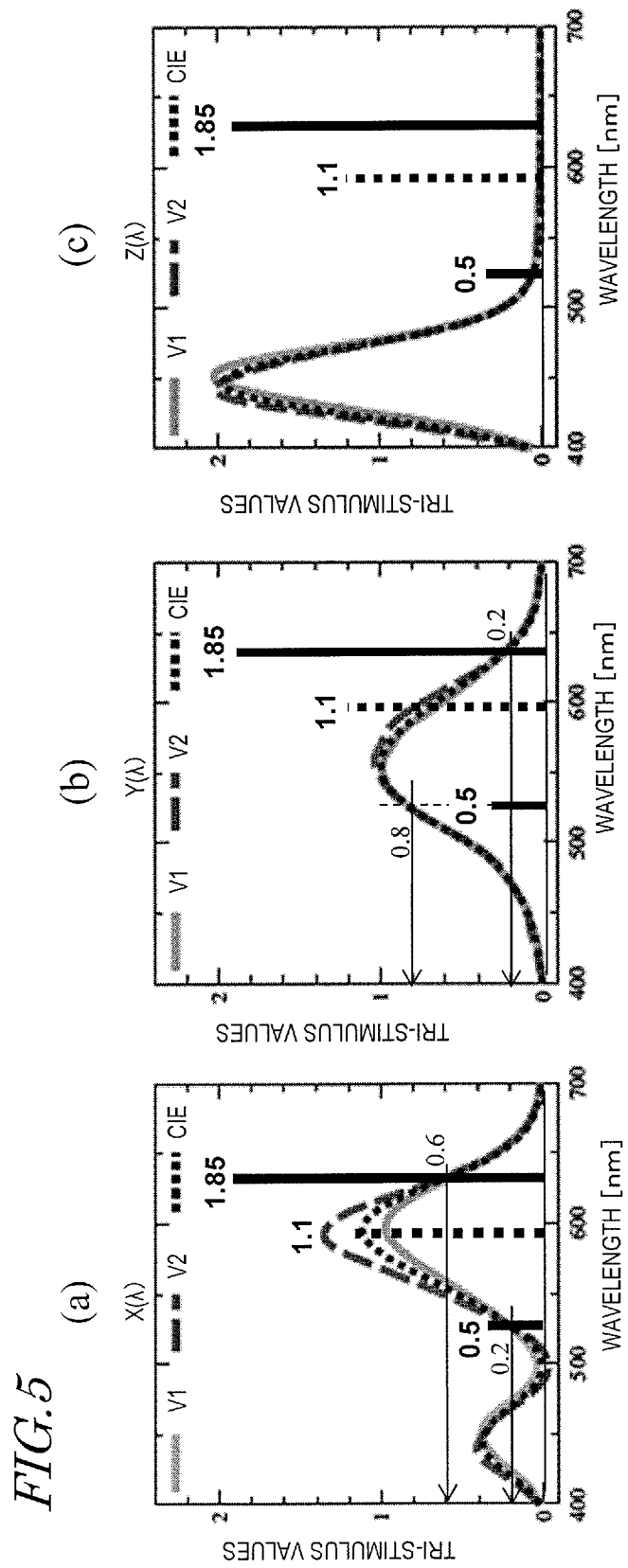
FIG. 5(a), FIG. 5(b) and FIG. 5(c) are each a graph showing the CIE color-matching function, the color-matching function of viewer V1 and the color-matching function of viewer V2.

Now, with reference to FIG. 5, a case will be discussed in which red light and green light each having a very steep spectrum (i.e., of a substantially single wavelength) are emitted and yellow light is created by color mixture thereof. Specifically, a case will be discussed in which yellow light having a wavelength of 590 nm is created by color mixture of red light having a wavelength of 630 nm and green light having a wavelength of 530 nm. FIG. 5(*a*), FIG. 5(*b*) and FIG. 5(*c*) respectively show the same color-matching functions as those shown in FIG. 4(*a*), FIG. 4(*b*) and FIG. 4(*c*). In FIG. 5(*a*), FIG. 5(*b*) and FIG. 5(*c*), the solid bars and the dashed bar schematically represent the red light and the green light to be emitted and the yellow light to be created by color mixture. As shown in the figures, color mixture of red light having a light emission intensity of 1.85 at a wavelength of 630 nm and green light having a light emission intensity of 0.5 at a wavelength of 530 nm results in creating yellow light having a light emission intensity corresponding to 1.1 at a wavelength of 590 nm.

For example, the color-matching function X(λ) shown in FIG. 5(*a*) will be paid attention to. At and around a wavelength of 530 nm and at and around a wavelength of 630 nm, the individual difference on the color-matching function X(λ) is very small. By contrast, as can be seen from the above, the individual difference on the color-matching function X(λ) is large at and around a wavelength of 590 nm. In FIG. 5(*a*), numerical values "0.6" and "0.2" are shown near the bars representing red and green light. These numerical values are respectively the value of X obtained when red light having a light emission intensity of 1 at a wavelength of 630 nm is viewed and the value of X obtained when green light having a light emission intensity of 1 at a wavelength of 530 nm is viewed (in FIG. 5(*b*), numerical values "0.2" and "0.8" represent such values).

Yellow created by color mixture of red and green as described above is considered as a standard color in the CIE. However, this yellow is perceived brighter than the actual brightness by viewer V1 and is perceived darker than the actual brightness by viewer V2.

Figure 6:
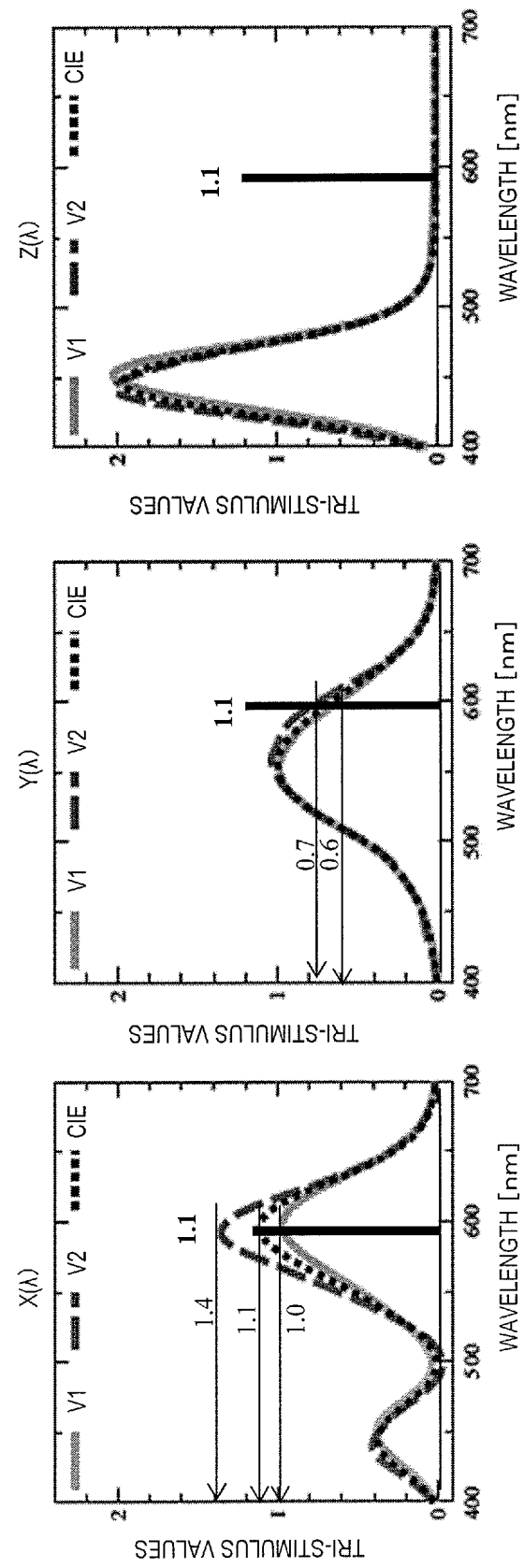
FIG. 6(a), FIG. 6(b) and FIG. 6(c) are each a graph showing the CIE color-matching function, the color-matching function of viewer V1 and the color-matching function of viewer V2.

With reference to FIG. 6, a case will be discussed in which yellow light having a wavelength of 590 nm is emitted. FIG. 6(*a*), FIG. 6(*b*) and FIG. 6(*c*) respectively show the same color-matching functions as those shown in FIG. 4(*a*), FIG. 4(*b*) and FIG. 4(*c*). The solid bar schematically represents the yellow light to be emitted by the solid bar.

In this case also, the color-matching function X(λ) shown in FIG. 6(*a*) will be paid attention to. In FIG. 6(*a*), numerical values "1.1", "1.0" and "1.4" are shown near the bar representing yellow. These numerical values are respectively the values of X obtained when yellow light having a light emission intensity of 1 at a wavelength of 590 nm is viewed by the color-matching function X(λ) of CIE, the color-matching function X(λ) of viewer V1, and the color-matching function X(λ) of viewer V2 (in FIG. 6(*b*), numerical values "0.6" and "0.7" represent such values).

The above-described yellow light is perceived by viewer V1 with his/her own color-matching function, and is perceived by viewer V2 with his/her own color-matching function. Therefore, viewer V1 and viewer V2 perceive the yellow color having the actual brightness. For this reason, color variance due to the individual difference on the color-matching function is not caused. From this, it is seen that in order to alleviate the color variance due to the individual difference on the color-matching functions, it is preferable to emit light in a wavelength range in which the individual difference on the color-matching functions is large.

Figure 7:
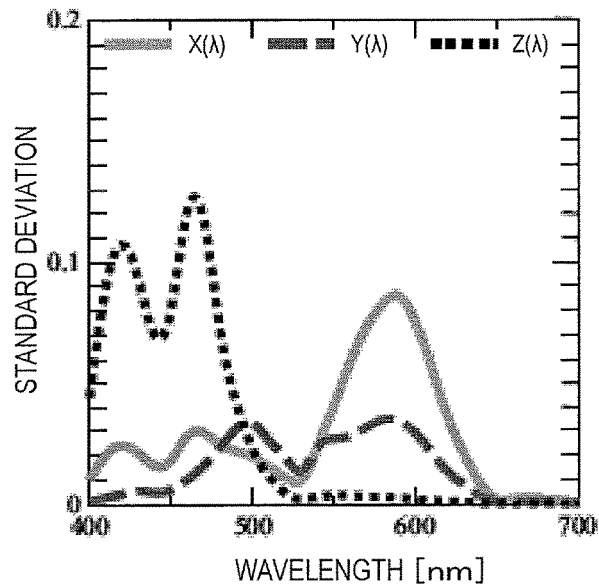
FIG. 7 is a graph showing the standard deviation at each wavelength, which is calculated from the color-matching functions of 51 people.

FIG. 7 shows the standard deviation at each wavelength, which is calculated from the color-matching functions of 51 people. As the standard deviation value is higher, the individual difference is larger. It is seen from FIG. 7 that the individual difference on the color-matching functions X(λ) and Y(λ) is large in the wavelength range of 550 nm to 650 nm.

Figure 8:
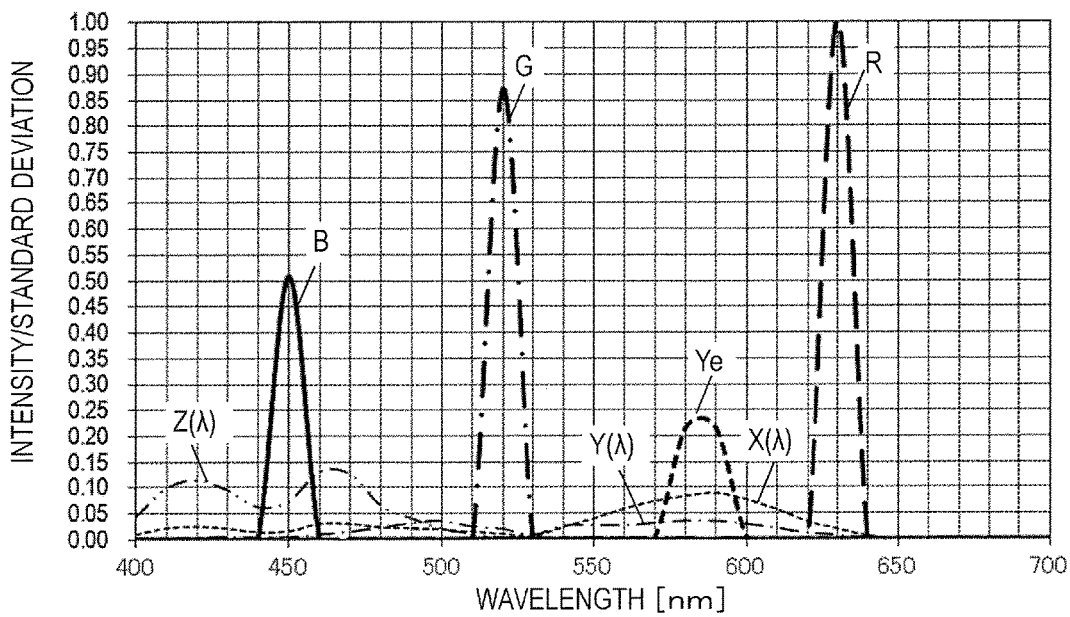
FIG. 8 is a graph showing spectra of red light, green light, blue light and yellow light respectively emitted by the red light emitting element 1r, the green light emitting element 1g, the blue light emitting element 1b and the yellow light emitting element 1y in the display device 100, and also showing the standard deviations of color-matching functions calculated from the color-matching functions of the 51 people.

In this embodiment, the display panel 10 includes the yellow light emitting element 1*y* emitting yellow light having a dominant wavelength of 550 nm or greater and 600 nm or less. In this case, as can be seen from FIG. 8, yellow light is emitted in a wavelength range in which the individual difference on the color-matching functions is large. Therefore, the variance in a color perceived by viewers is alleviated. The dominant wavelength of the yellow light does not need to exceed 600 nm. A reason for this is that the wavelength range of 600 nm to 650 nm may be covered by red light.

An investigation was made on how much the color variance would be alleviated by providing the above-described yellow light emitting element 1*y*. The results will be explained. Before this, the relationship among the spectrum half width of each of the three primary colors (red, green, blue), the color reproduction range, and the variance in a color perceived by viewers (individual difference LE) will be described.

Figure 9:
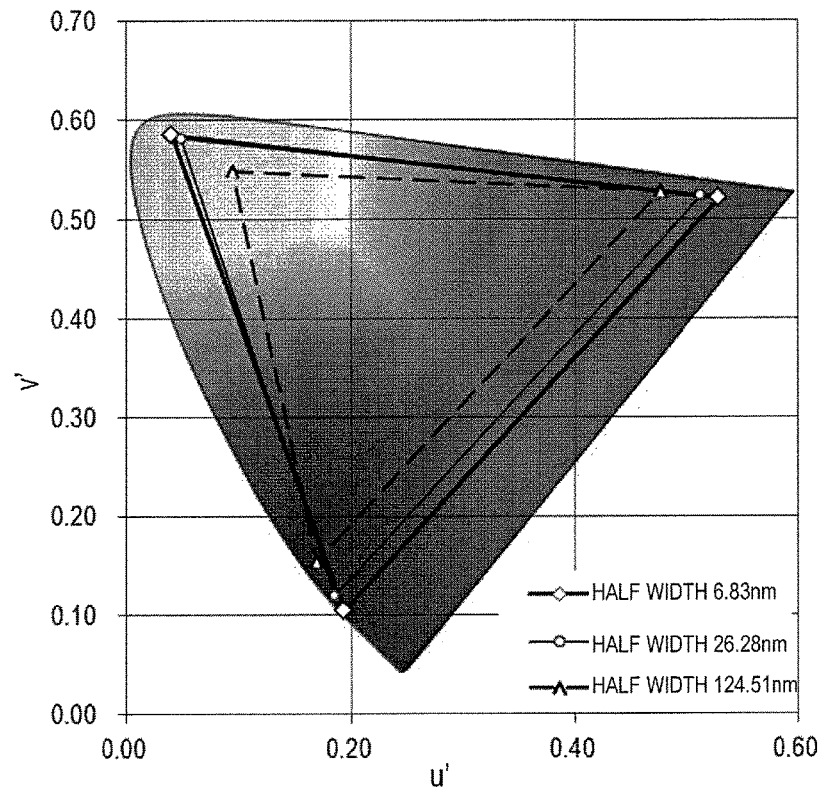
FIG. 9 is a u′ v′ chromaticity diagram showing color reproduction ranges in the case where the spectrum half width of each of three primary colors is 6.83 nm, 26.28 nm and 124.51 nm.

FIG. 9 shows a color reproduction range in the cases where the spectrum half width of each of the three primary colors is 6.83 nm, 26.28 nm and 124.51 nm. As can be seen from FIG. 9, as the spectrum half width of each of the three primary colors is narrower, the color reproduction range is broader. Based on this, the color range is broadened by narrowing the spectrum half width of each of the three primary colors.

Figure 10:
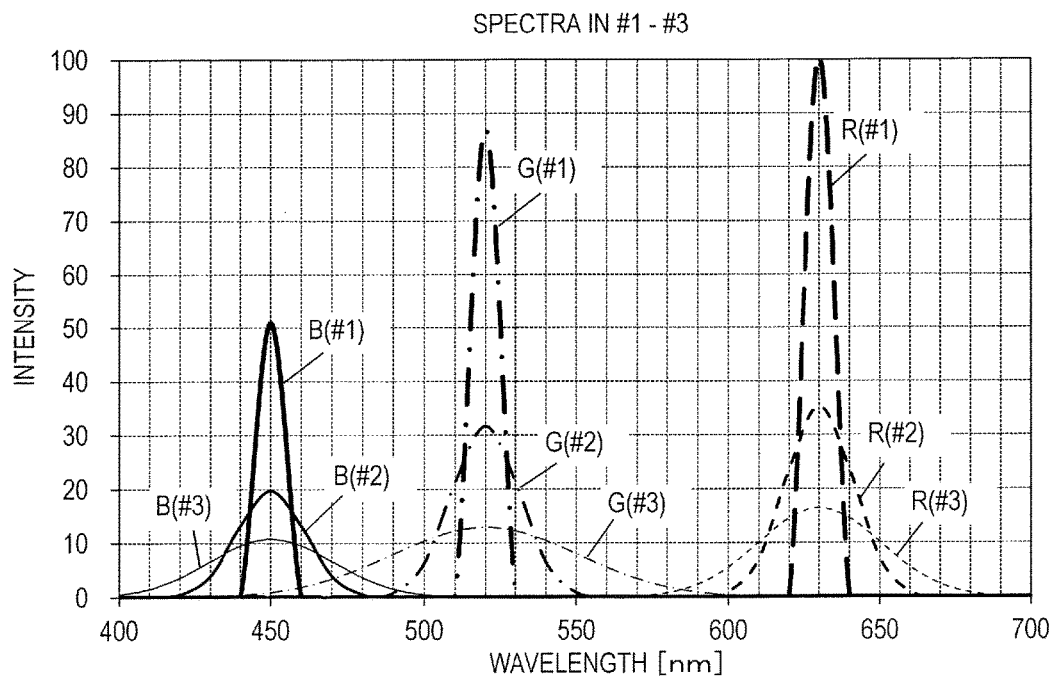
FIG. 10 is a graph showing spectra of red, green and blue in three cases of #1, #2 and #3.

However, when the spectrum half width of each of the three primary colors is narrowed, the color variance due to the individual difference on the color-matching functions is increased. Table 1 below shows the results of calculation of individual difference ΔE in three cases of different spectrum half widths of the three primary colors (#1, #2 and #3). #1 is the case where the spectrum half width of each of red, green and blue is 10 nm, #2 is the case where the spectrum half width of each of red, green and blue is 30 nm, and #3 is the case where the spectrum half widths of red, green and blue are respectively 50 nm, 75 nm and 50 nm. The spectra of red, green and blue in #1, #2 and #3 are shown in FIG. 10. Table 1 shows, as the individual difference λE, the individual difference Δ for 15 colors extracted from the Standard Object Color Spectra (SOCS) Database and the average thereof. A method for calculating the individual difference ΔE will be described later in detail.

TABLE 1

| Primary colors<br>Half width | #1 | | | #2 | | | #3 | | |
|---|---|---|---|---|---|---|---|---|---|
| | R<br>10 nm | G<br>10 nm | B<br>10 nm | R<br>30 nm | G<br>30 nm | B<br>30 nm | R<br>50 nm | G<br>75 nm | B<br>50 nm |
| | Individual difference ΔE | | | Individual difference ΔE | | | Individual difference ΔE | | |
| Color No. 1 | | 1.74 | | | 1.26 | | | 0.63 | |
| 2 | | 2.49 | | | 1.80 | | | 0.90 | |
| 3 | | 2.88 | | | 2.09 | | | 1.06 | |
| 4 | | 1.69 | | | 1.28 | | | 0.76 | |
| 5 | | 1.59 | | | 1.21 | | | 0.72 | |
| 6 | | 1.79 | | | 1.37 | | | 0.93 | |
| 7 | | 2.15 | | | 1.56 | | | 0.98 | |
| 8 | | 2.35 | | | 1.66 | | | 0.84 | |
| 9 | | 1.50 | | | 1.05 | | | 0.57 | |
| 10 | | 1.75 | | | 1.28 | | | 0.76 | |
| 11 | | 1.92 | | | 1.48 | | | 1.00 | |
| 12 | | 2.15 | | | 1.78 | | | 1.39 | |
| 13 | | 2.14 | | | 1.69 | | | 1.20 | |
| 14 | | 1.95 | | | 1.55 | | | 1.11 | |
| 15 | | 1.92 | | | 1.45 | | | 0.87 | |
| Average | | 2.00 | | | 1.50 | | | 0.91 | |

As can be seen from Table 1, the average individual difference ΔE is 0.91 in #3, whereas the average individual difference ΔE is 1.50 in #2 and is 2.00 in #1. As can be seen, as the spectrum half width of each of the three primary colors is narrower, the individual difference ΔE is larger. Especially when the spectrum half width of each of the three primary colors is 10 nm or less, the average individual difference ΔE is 2.00.

Figure 11:
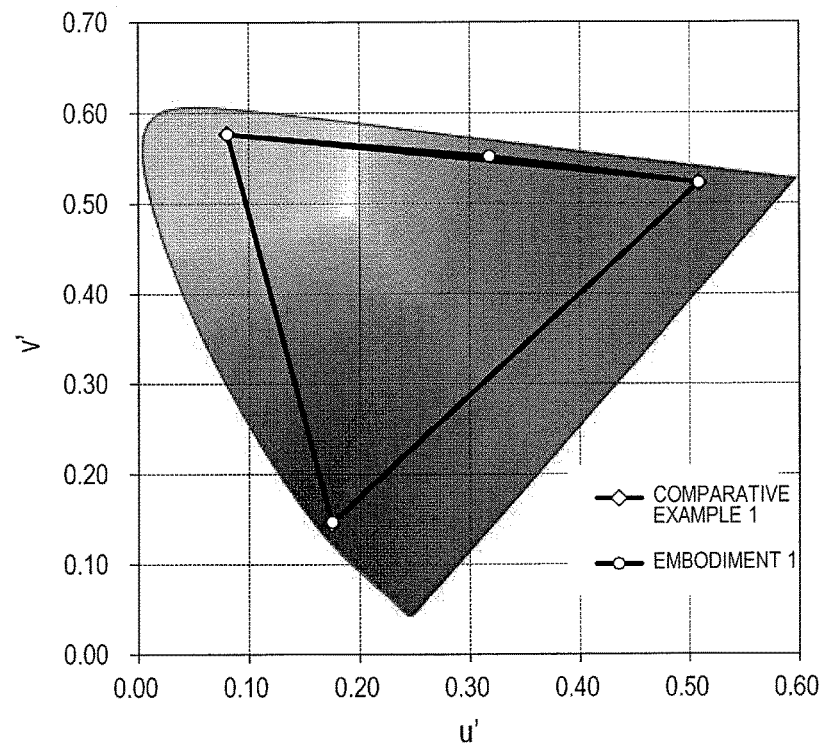
FIG. 11 is a u′v′ chromaticity diagram showing color reproduction ranges of a display device in comparative example 1 and the display device 100.
Figure 12:
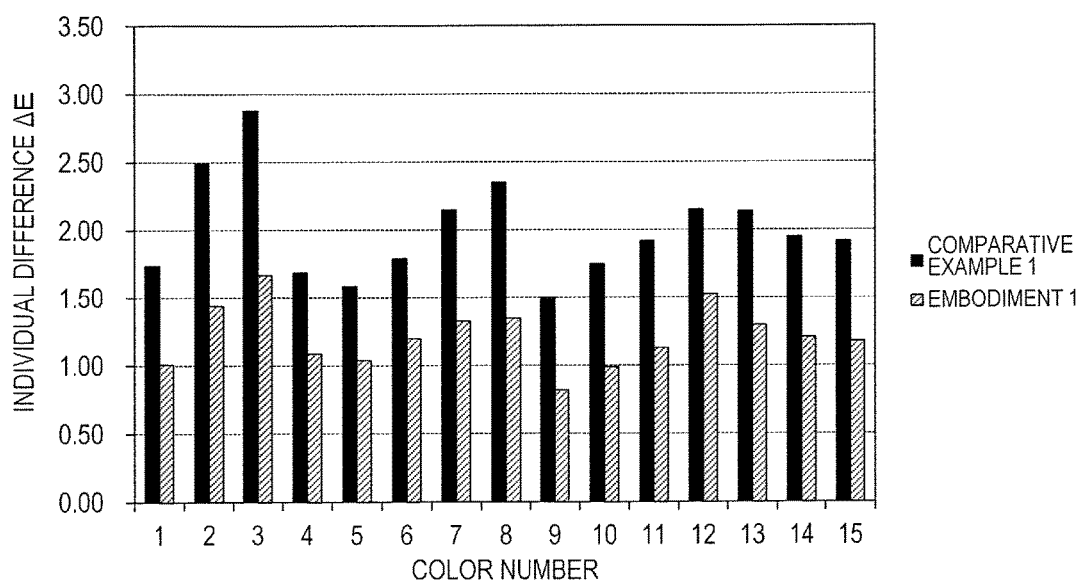
FIG. 12 is a graph showing results of calculation of individual difference ΔE in the display device in comparative example 1 and the display device 100.

FIG. 11 shows color reproduction ranges of a display device in comparative example 1 and the display device 100 in this embodiment. Table 2 below and FIG. 12 show results of calculation of individual difference ΔE in the display device in comparative example 1 and the display device 100 in this embodiment. In the display device in comparative example 1, each of pixels includes a red sub pixel, a green sub pixel and a blue sub pixel, and the spectrum half width of each of red, green and blue is 10 nm (corresponding to #1 above). FIG. 12 shows the individual difference ΔE for the 15 colors, and Table 2 shows the individual difference ΔE for the 15 colors and also the average individual difference ΔE and the maximum individual difference ΔE.

TABLE 2

| | Individual difference ΔE | |
|---|---|---|
| Color No. | Comparative example 1 | Embodiment 1 |
| 1 | 1.74 | 1.01 |
| 2 | 2.49 | 1.44 |
| 3 | 2.88 | 1.67 |
| 4 | 1.69 | 1.09 |
| 5 | 1.59 | 1.04 |
| 6 | 1.79 | 1.20 |
| 7 | 2.15 | 1.33 |
| 8 | 2.35 | 1.35 |
| 9 | 1.50 | 0.82 |
| 10 | 1.75 | 0.99 |
| 11 | 1.92 | 1.13 |
| 12 | 2.15 | 1.53 |
| 13 | 2.14 | 1.30 |
| 14 | 1.95 | 1.21 |
| 15 | 1.92 | 1.18 |
| Average | 2.00 | 1.22 |
| Maximum | 2.88 | 1.67 |

As can be seen from FIG. 11, the display device in comparative example 1 and the display device 100 in this embodiment have substantially the same color reproduction range. As can be seen from Table 2 and FIG. 12, the individual difference ΔE for the 15 colors, the average individual difference ΔE and the maximum individual difference ΔE are all smaller in the display device 100 in this embodiment than in the display device in comparative example 1.

As can be seen, the display device 100 in this embodiment decreases the individual difference ΔE without narrowing the color reproduction range. Therefore, the variance in a color perceived by viewers, which is caused by the individual difference on the color-matching functions, is alleviated.

Figure 13:
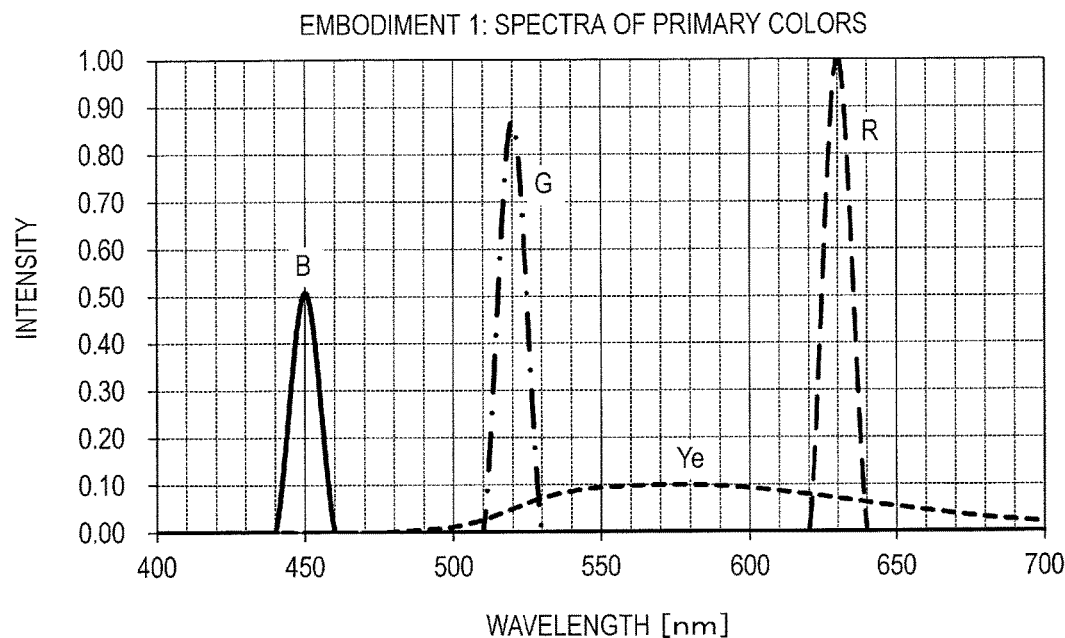
FIG. 13 is a graph showing spectra of red light, green light, blue light and yellow light respectively emitted by the red light emitting element 1r, the green light emitting element 1g, the blue light emitting element 1b and the yellow light emitting element 1y in the display device 100.
Figure 14:
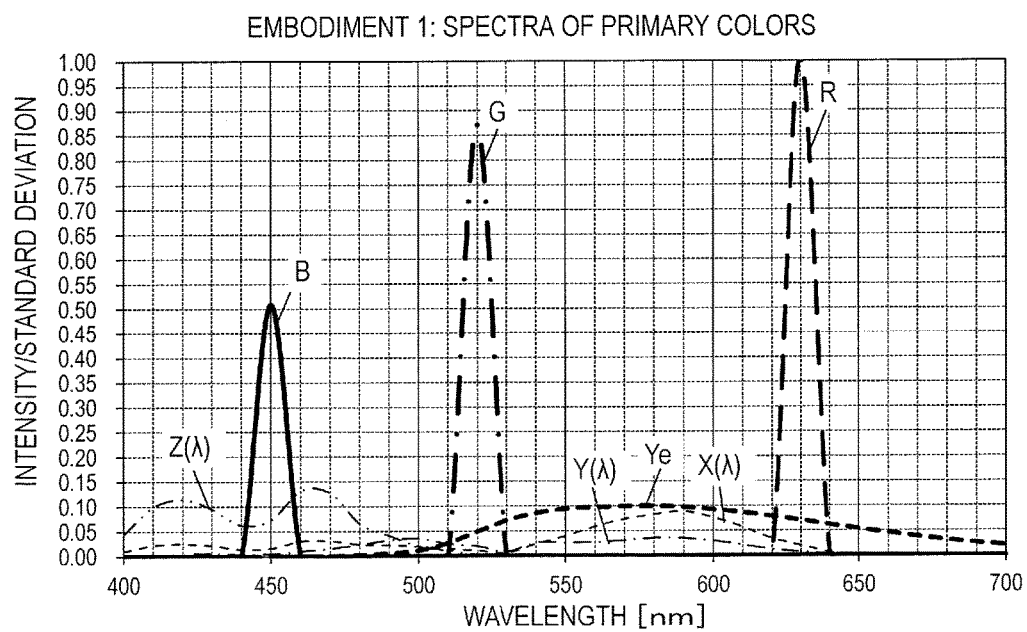
FIG. 14 is a graph showing spectra of red light, green light, blue light and yellow light respectively emitted by the red light emitting element 1r, the green light emitting element 1g, the blue light emitting element 1b and the yellow light emitting element 1y in the display device 100, and also showing the standard deviations of color-matching functions calculated from the color-matching functions of the 51 people.

The spectrum of the yellow color emitted by the yellow light emitting element 1y is not limited to that shown in FIG. 2 or the like. In the example shown in FIG. 2, the spectrum half width of the yellow light is 20 nm. For example, a yellow light emitting element 1y emitting yellow light having a broader spectrum as shown in FIG. 13 may be provided. In this case also, the yellow light is emitted in a wavelength range in which the individual difference on the color-matching functions is large as shown in FIG. 14, and therefore the variance in a color perceived by viewers is alleviated.

Figure 15:
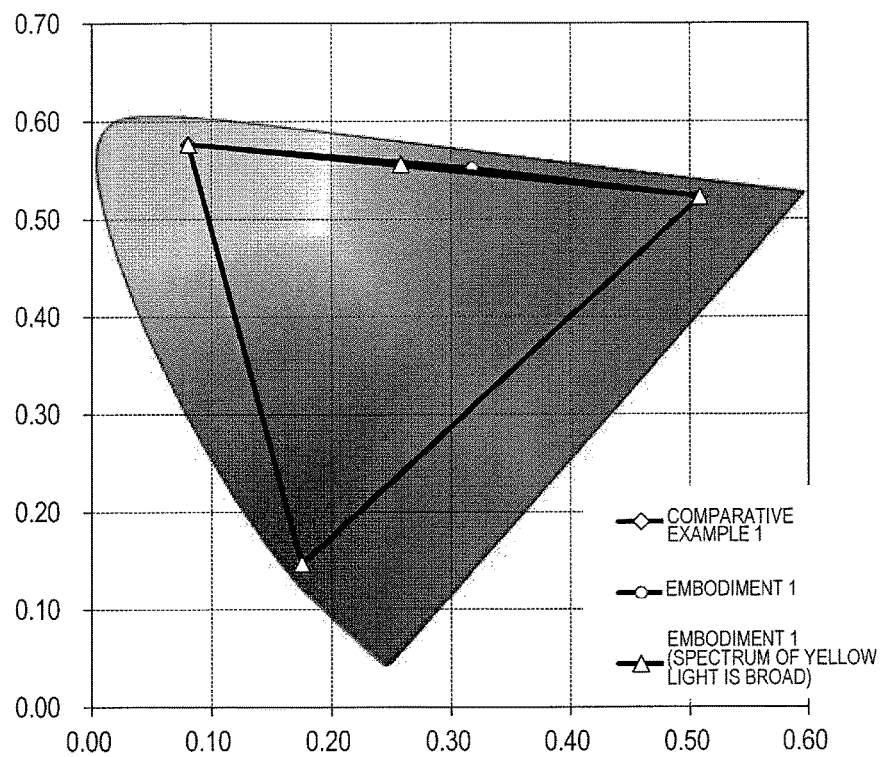
FIG. 15 is a u′v′ chromaticity diagram showing color reproduction ranges of the display device in comparative example 1 and the display device 100.
Figure 16:
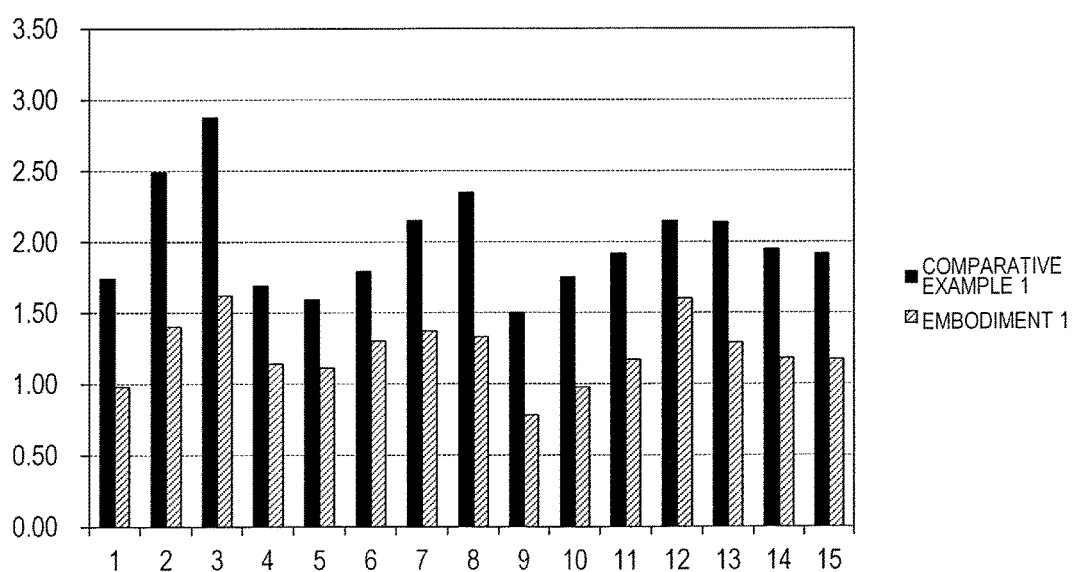
FIG. 16 is a graph showing results of calculation of individual difference ΔE in the display device in comparative example 1 and the display device 100.

FIG. 15 shows color reproduction ranges of the display device in comparative example 1 and the display device 100 in this embodiment. The display device 100 uses the yellow light emitting element 1y emitting yellow light having the spectrum shown in FIG. 13. Table 3 below and FIG. 16 show results of calculation of individual difference ΔE in the display device in comparative example 1 and the display device 100 in this embodiment. The display device 100 uses the yellow light emitting element 1y emitting yellow light having the spectrum shown in FIG. 13. FIG. 15 also shows, for reference, the color reproduction range in the display device 100 in the case where the yellow light emitting element 1y emitting yellow light having the spectrum shown in FIG. 2 is used.

TABLE 3

| Color No. | Individual difference ΔE | |
|---|---|---|
| | Comparative example 1 | Embodiment 1 |
| 1 | 1.74 | 0.98 |
| 2 | 2.49 | 1.40 |
| 3 | 2.88 | 1.62 |
| 4 | 1.69 | 1.14 |
| 5 | 1.59 | 1.11 |
| 6 | 1.79 | 1.30 |
| 7 | 2.15 | 1.37 |
| 8 | 2.35 | 1.33 |
| 9 | 1.50 | 0.78 |
| 10 | 1.75 | 0.98 |
| 11 | 1.92 | 1.17 |
| 12 | 2.15 | 1.60 |
| 13 | 2.14 | 1.29 |
| 14 | 1.95 | 1.18 |
| 15 | 1.92 | 1.17 |
| Average | 2.00 | 1.23 |
| Maximum | 2.88 | 1.62 |

As can be seen from FIG. 15, even in the case where the yellow light emitting element 1y emitting yellow light having a broad spectrum is provided in the display device 100, the display device in comparative example 1 and the display device 100 in this embodiment have substantially the same color reproduction range. As can be seen from Table 3 and FIG. 16, even in the case where the yellow light emitting element 1y emitting yellow light having a broad spectrum is provided in the display device 100, the individual difference ΔE for the 15 colors, the average individual difference ΔE and the maximum individual difference ΔE are all smaller in the display device 100 in this embodiment than in the display device in comparative example 1.

In the example shown in FIG. 1, the red sub pixel R, the green sub pixel G, the blue sub pixel B and the yellow sub pixel Ye are arranged in this order from left to right in each pixel P. The arrangement of the plurality of sub pixels in the pixel P is not limited to that shown in FIG. 1. The red sub pixel R, the green sub pixel G, the blue sub pixel B and the yellow sub pixel Ye may be arranged in any order in the pixel P.

In the example shown in FIG. 1, the plurality of sub pixels are arrayed in one row by a plurality of columns in the pixel P. Alternatively, the plurality of sub pixels may be arrayed in a plurality of rows by one column in the pixel P. Still alternatively, the plurality of sub pixels may be arrayed in a plurality of rows by a plurality of columns (i.e., in a matrix) in the pixel P.

In this embodiment, each pixel P includes four sub pixel (red sub pixel R, green sub pixel G, blue sub pixel B and yellow sub pixel Ye). Alternatively, each pixel P may include five or more sub pixels. For example, the plurality of sub pixels included in each pixel P may include a cyan sub pixel in addition to the red sub pixel R, the green sub pixel G, the blue sub pixel B and the yellow sub pixel Ye. In this case, a cyan light emitting element is provided in an area corresponding to the cyan sub pixel in the display panel 10.

In the example shown in FIG. 11, the chromaticity of yellow displayed by the yellow sub pixel Ye is on a side of a triangle having, as apexes, the chromaticities of red, green and blue displayed by the red sub pixel R, the green sub pixel G and the blue sub pixel B on the chromaticity diagram. The chromaticity of yellow may be present on the inside of, or on the outside of, the triangle. In the case where the chromaticity of yellow displayed by the yellow sub pixel Ye is present on the outside of the triangle on the chromaticity diagram, the color reproduction range may be broader. Needless to say, the variance in a color perceived by viewers may be alleviated. In the case where the chromaticity of yellow displayed by the yellow sub pixel Ye is present on a side of, or on the inside of, the triangle on the chromaticity diagram, the variance in a color perceived by viewers may be alleviated although the color reproduction range is not made broader. In addition, there is an advantage that the light emission efficiency of the entire panel is improved.

Now, a method for evaluating the variance in a color perceived by viewers (i.e., method for calculating the individual difference ΔE) will be explained.

In the case where each pixel includes three sub pixels (red sub pixel, green sub pixel and blue sub pixel) (corresponding to comparative example 1), the evaluation may be made as follows.

(1) Coefficients (intensities) Rw, Gw and Bw of red, green and blue are adjusted and determined such that white light having the same color as that of the D65 standard light source is provided by color mixture thereof.

Figure 17:
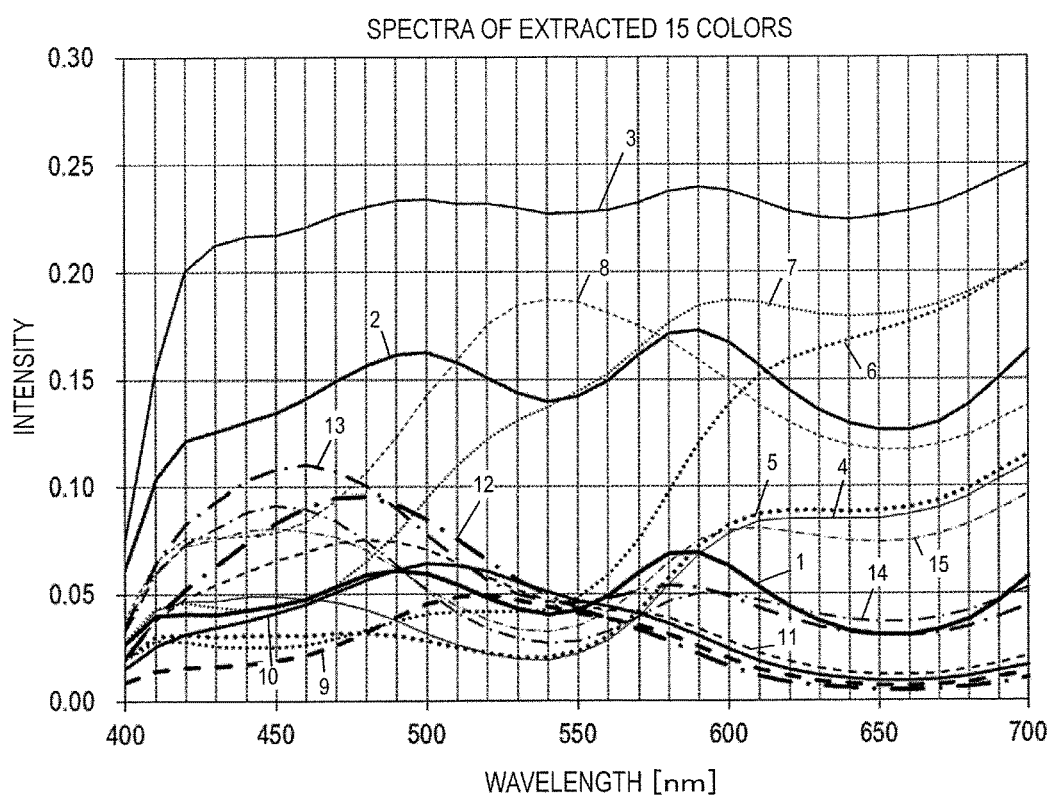
FIG. 17 is a graph showing spectra of 15 colors (color numbers 1 through 15) extracted from the SOCS database.
Figure 18:
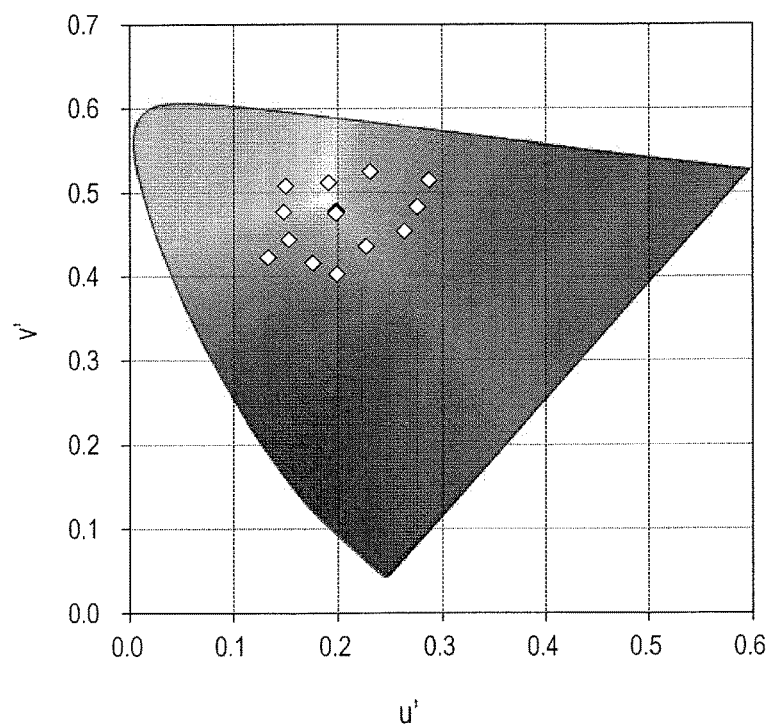
FIG. 18 is a u′v′ chromaticity diagram showing chromaticities of the 15 colors extracted from the SOCS database.

(2) One color (herein, C1) is picked up from the 15 colors extracted from the SOCS database, and coefficients (intensities) Rc1, Gc1 and Bc1 of red, green and blue are adjusted and determined such that color C1 is provided by color mixture thereof. The spectra of the 15 colors (color numbers 1 through 15) extracted from the SOCS database are shown in FIG. 17. The chromaticities of the 15 colors are shown in FIG. 18.

Figure 19:
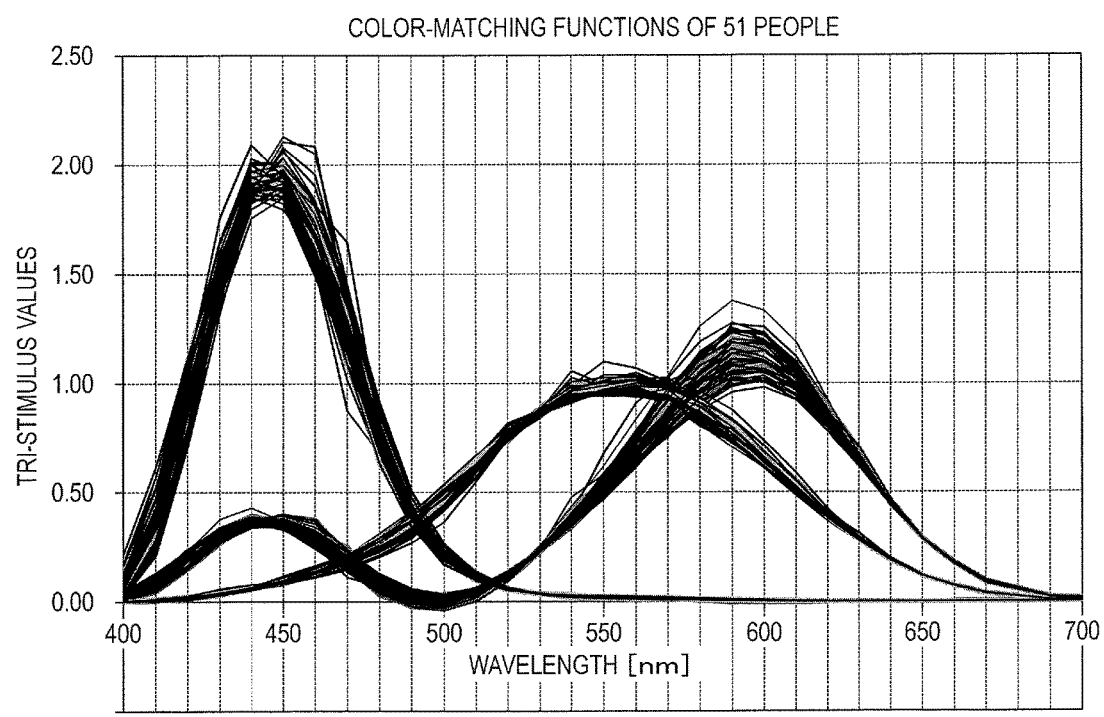
FIG. 19 is a graph showing the color-matching functions of the 51 people.

(3) Regarding the D65 standard light source and the picked up color C1, the color-matching functions of the 51 people are used to calculate colors (Xwi, Ywi, Zwi), (Xi, Yi, Zi) perceived by each individual (i=1-51). The color-matching functions of the 51 people are shown in FIG. 19.

(4) Regarding the D65 standard light source and the picked up color C1, the CIE standard color-matching functions are used to calculate colors (Xwcie, Ywcie, Zwcie), (Xcie, Ycie, Zcie) which will be perceived when the D65 standard light source and the picked up color C1 are viewed with the standard color-matching functions.

(5) From (Xwi, Ywi, Zwi), (Xi, Yi, Zi) calculated in step (3) above, (L*1, a*1, b*1) are calculated. (L*1, a*1, b*1) are calculated by expressions (1) through (3) below.

$$L*i = 116 f(Yi/Ywi) - 16 \quad (1)$$

$$a*i = 500[f(Xi/Xwi) - f(Yi/Ywi)] \quad (2)$$

$$b*i = 200[f(Yi/Ywi) - f(Zi/Zwi)] \quad (3)$$

In the case where $t > (6/29)^3$, $f(t) = t^{-3}$. Otherwise, $f(t) = (1/3)(29/6)^2 t + (4/29)$.

(6) Similarly, from (Xwcie, Ywcie, Zwcie), (Xcie, Ycie, Zcie) calculated in step (4) above, (L*cie, a*cie, b*cie) are calculated.

(7) From (L*i, a*i, b*i) and (L*cie, a*cie, b*cie) calculated in steps (5) and (6), ΔE of each individual is calculated. ΔE is calculated by expression (4) below.

$$\Delta E = [(L*cie - L*i)^2 + (a*cie - a*i)^2 + (b*cie - b*i)^2]^{1/2} \quad (4)$$

(8) ΔE of the 51 people are averaged to find individual difference ΔS for color C1.

(9) Similarly, the individual difference ΔE for the remaining 14 colors is found, and the average individual difference ΔE of the 15 colors is also found.

In the case where each pixel P includes four sub pixels (red sub pixel R, green sub pixel G, blue sub pixel B and yellow sub pixel Ye) (corresponding to the display device 100 in this embodiment), the evaluation may be made basically in the same manner. However, the calculations are more complicated due to the color redundancy specific to the case where four primary colors are used for display (there are a plurality of combinations of primary color intensities for creating one, same color). Specifically, in the case where there are four primary colors, the coefficients are determined by an optimization method in evaluation steps (2) through (5), unlike in the case where there are three primary colors.

In the case where there are four primary colors, there are a plurality of combinations of primary color intensities for creating a certain color (by color mixture). Therefore, in step (2), variants are provisionally used as coefficients (intensities) Rc1, Gc1, Bc1 and Yc1, and then the coefficients of the four colors are found such that ΔE is the minimum value by use of an optimization method such as GRG (Generalized Reduced Gradient) method or the like.

(Embodiment 2)

Figure 20:
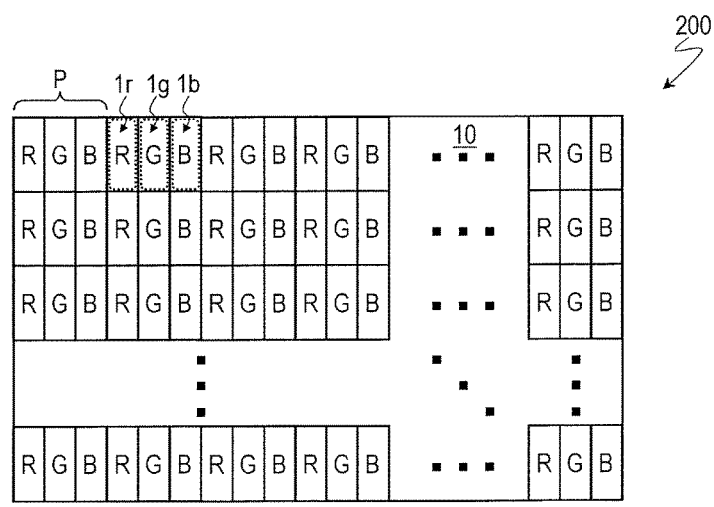
FIG. 20 is a plan view schematically showing a display device 200 in an embodiment according to the present invention.

FIG. 20 shows a display device 200 in this embodiment. FIG. 20 is a plan view schematically showing the display device 200.

As shown in FIG. 20, the display device 200 includes a spontaneous light emission-type display panel 10. The display device 200 includes a plurality of pixels P.

The plurality of pixels P are arrayed in a matrix including rows and columns. The plurality of pixels P each include a red sub pixel R, a green sub pixel G and a blue sub pixel B. Namely, the plurality of sub pixels included in each pixel P do not include a yellow sub pixel.

The display panel 10 includes a red light emitting element 1r provided in an area corresponding to the red sub pixel R, a green light emitting element 1g provided in an area corresponding to the green sub pixel G, and a blue light emitting element 1b provided in an area corresponding to the blue sub pixel B. The red light emitting element 1r, the green light emitting element 1g and the blue light emitting element 1b are each, for example, an organic EL element. Needless to say, each of the red light emitting element 1r, the green light emitting element 1g and the blue light emitting element 1b is not limited to being an organic EL element, and may be any of various known spontaneous light emission-type elements (e.g., inorganic EL element).

Figure 21:
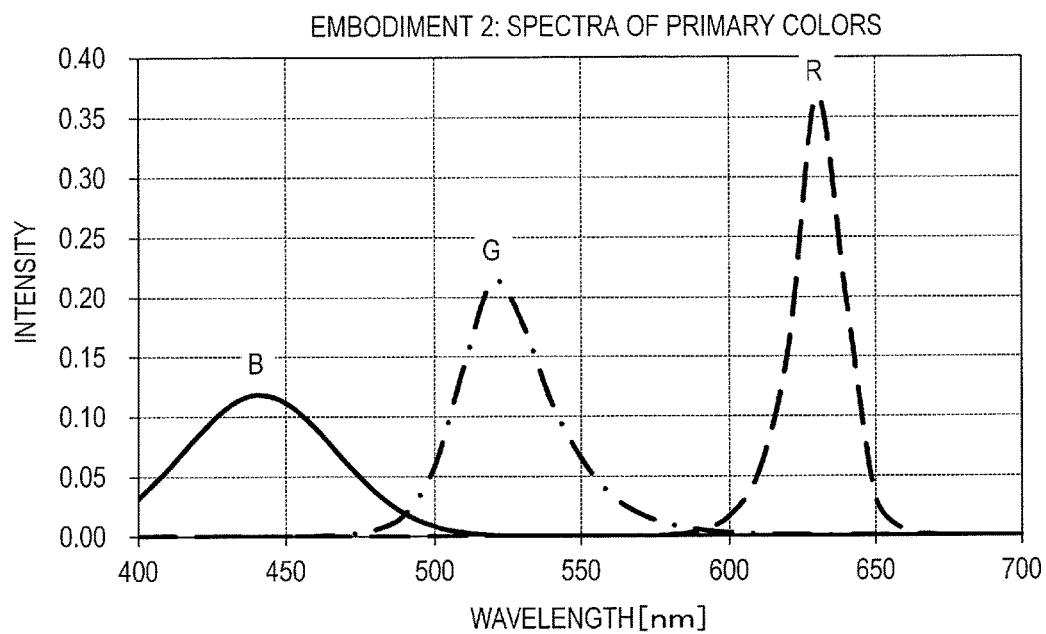
FIG. 21 is a graph showing spectra of red light, green light and blue light respectively emitted by the red light emitting element 1r, the green light emitting element 1g and the blue light emitting element 1b in the display device 200.

FIG. 21 shows spectra of red light, green light and blue light respectively emitted by the red light emitting element 1r, the green light emitting element 1g and the blue light emitting element 1b. As shown in FIG. 21, the blue light emitted by the blue light emitting element 1b does not substantially include a component having a wavelength exceeding 525 nm, and has a spectrum half width exceeding 20 nm. Namely, the spectrum of the blue light is broadened in the wavelength range of 525 nm or less.

Now, refer to FIG. 7 again. It is seen from FIG. 7 that the individual difference on the color-matching functions (especially, Z(λ)) is large in the wavelength range of 400 nm to 500 nm.

Figure 22:
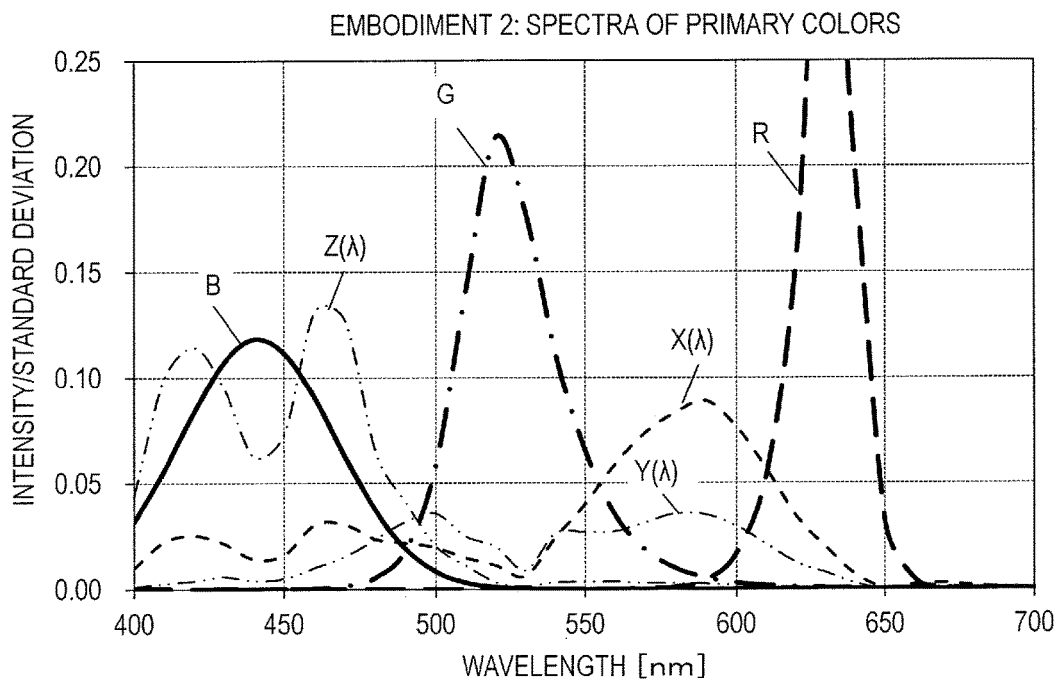
FIG. 22 is a graph showing spectra of red light, green light and blue light respectively emitted by the red light emitting element 1r, the green light emitting element 1g and the blue light emitting element 1b in the display device 200, and also showing the standard deviations of color-matching functions calculated from the color-matching functions of the 51 people.

As described above, in the display device 200 in this embodiment, the spectrum of the blue light emitted by the blue light emitting element 1b is broadened in the wavelength range of 525 nm or less. As can be seen from FIG. 22, the blue light is emitted so as to cover a broad wavelength range (400 nm to 500 nm) in which the individual difference on the color-matching functions is large. Therefore, the variance in a color perceived by viewers is alleviated.

Even when the spectrum of the blue light is broadened (i.e., even when the spectrum half width is made larger) in the wavelength range of 525 nm or less, the chromaticity of blue is not changed almost at all and the color reproduction range is not influenced almost at all. Therefore, the display device 200 alleviates the color variance caused by the individual difference on the color-matching functions without narrowing the color reproduction range.

Figure 23:
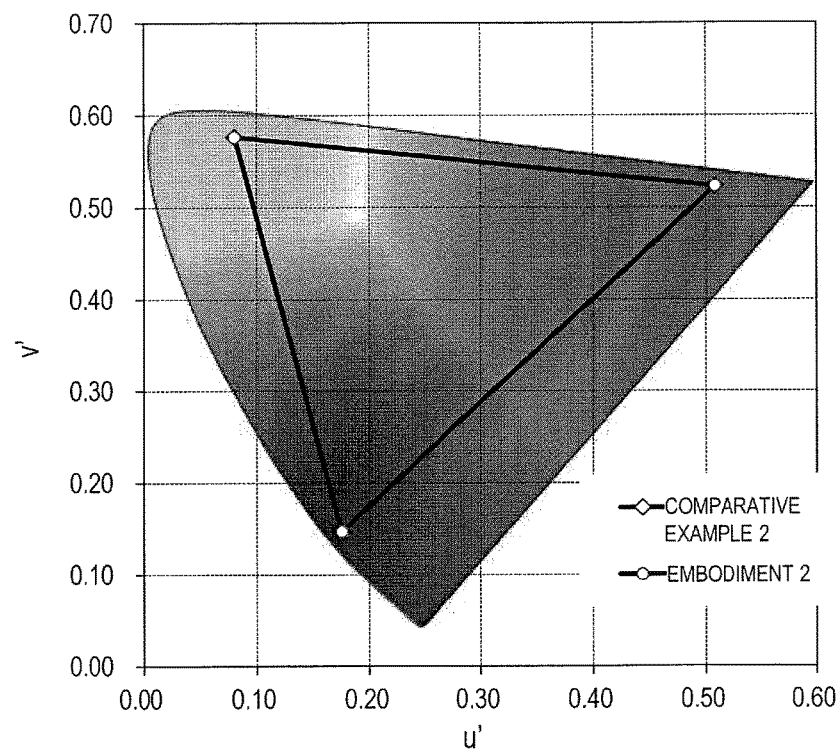
FIG. 23 is a u′v′ chromaticity diagram showing color reproduction ranges of a display device in comparative example 2 and the display device 200.
Figure 24:
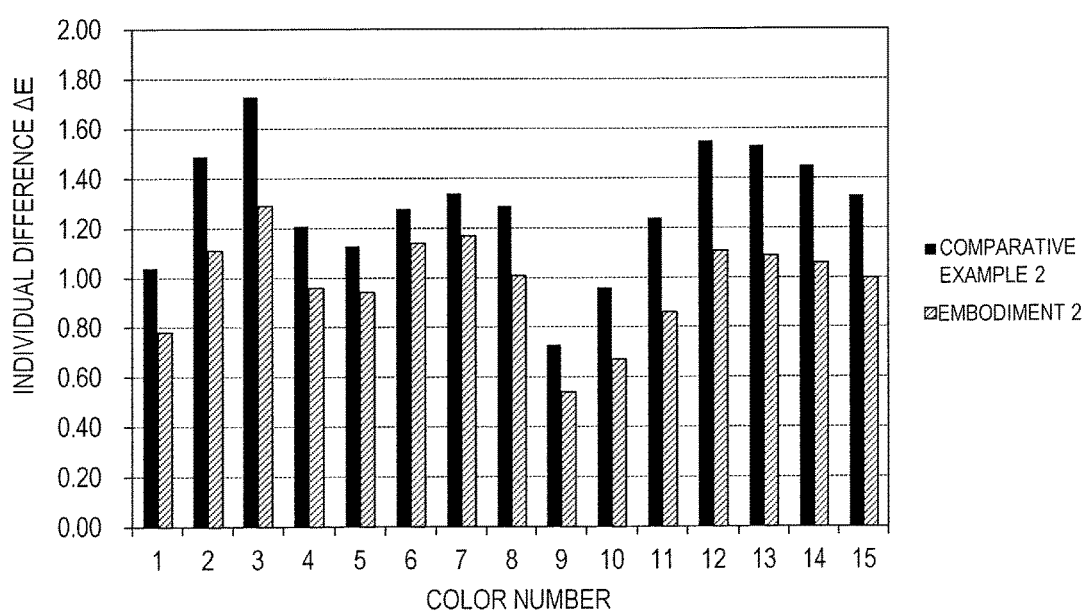
FIG. 24 is a graph showing results of calculation of individual difference ΔE in the display device in comparative example 2 and the display device 200.
Figure 25:
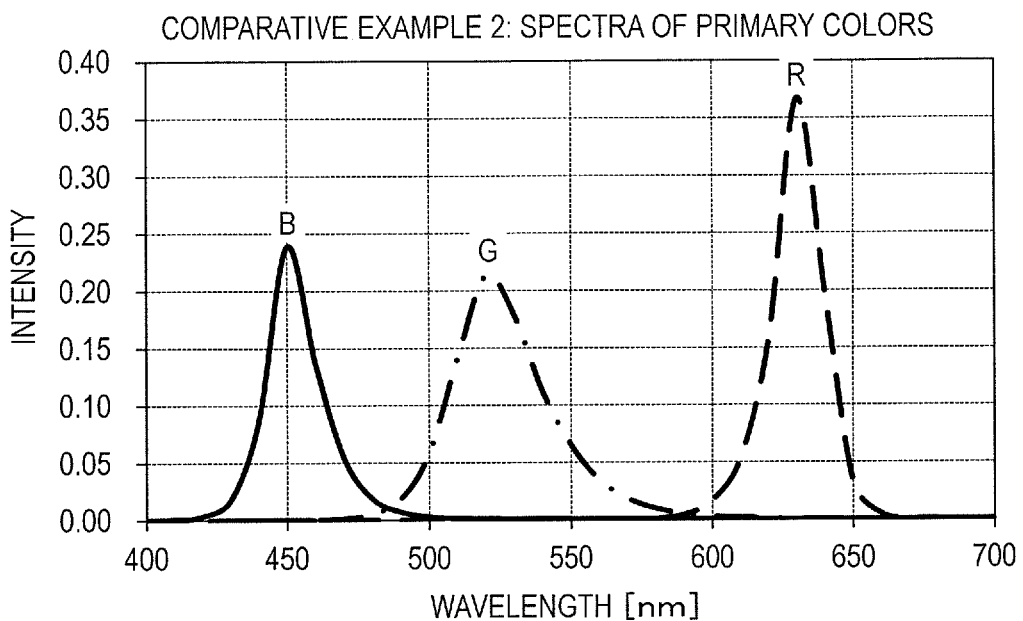
FIG. 25 is a graph showing spectra of red, green and blue in the display device in comparative example 2.

FIG. 23 shows color reproduction ranges of a display device in comparative example 2 and the display device 200 in this embodiment. Table 4 below shows chromaticities of red, green and blue, u' and in the display device in comparative example 2 and the display device 200 in this embodiment. Table 5 below and FIG. 24 show results of calculation of individual difference ΔE in the display device in comparative example 2 and the display device 200 in this embodiment. In the display device in comparative example 2, each of pixels includes a red sub pixel, a green sub pixel and a blue sub pixel, and the spectrum of each of red, green and blue is shown in FIG. 25. As shown in FIG. 25, in the display device in comparative example 2, the spectrum half width of the blue light is 20 nm. Namely, in the display device in comparative example 2, the spectrum of the blue light is not broadened.

TABLE 4

|   | Comparative example 2 Chromaticity | | Embodiment 2 Chromaticity | |
|---|---|---|---|---|
|   | u' | v' | u' | v' |
| R | 0.51 | 0.52 | 0.51 | 0.52 |
| G | 0.08 | 0.58 | 0.08 | 0.58 |
| B | 0.17 | 0.15 | 0.18 | 0.15 |

TABLE 5

| | Individual difference ΔE | |
|---|---|---|
| Color No. | Comparative example 2 | Embodiment 2 |
| 1 | 1.04 | 0.78 |
| 2 | 1.49 | 1.11 |
| 3 | 1.73 | 1.29 |
| 4 | 1.21 | 0.96 |
| 5 | 1.13 | 0.94 |
| 6 | 1.28 | 1.14 |
| 7 | 1.34 | 1.17 |
| 8 | 1.29 | 1.01 |
| 9 | 0.73 | 0.54 |
| 10 | 0.96 | 0.67 |
| 11 | 1.24 | 0.86 |
| 12 | 1.55 | 1.11 |
| 13 | 1.53 | 1.09 |
| 14 | 1.45 | 1.06 |
| 15 | 1.33 | 1.00 |
| Average | 1.29 | 0.98 |
| Maximum | 1.73 | 1.29 |

As can be seen from FIG. 23, the display device in comparative example 2 and the display device 200 in this embodiment have substantially the same color reproduction range. A reason for this is that as can be seen from Table 4, the chromaticity of blue is substantially the same. As can be seen from Table 5 and FIG. 24, the individual difference ΔE for the 15 colors, the average individual difference ΔE and the maximum individual difference ΔE are all smaller in the display device 200 in this embodiment than in the display device in comparative example 2.

As described above with reference to Table 1, as the spectrum half width of each of the three primary colors is narrower, the individual difference ΔE is larger. Specifically, when the spectrum half width of each of the three primary colors is 30 nm or less, the average individual difference ΔE is 1.50 or larger. When the spectrum half width of each of the three primary colors is 10 nm or less, the average individual difference ΔE is 2.00 or larger. Therefore, the effect provided by broadening the spectrum of the blue light in the wavelength range of 525 nm or less (the effect that the color variance caused by the individual difference on the color-matching functions is alleviated) is considered to be improved as the spectrum half width of each of red and green is narrower. More specifically, the above-described effect is considered to be high when the spectrum half width of each of the red light and the green light respectively emitted by the red light emitting element 1r and the green light emitting element 1g is 30 nm or less, and is considered to be still higher when the spectrum half width of each of the red light and the green light is 10 nm or less.

From the point of view of alleviating the color variance caused by the individual difference on the color-matching functions more certainly, the spectrum half width of the blue light emitted by the blue light emitting element 1g is preferably 30 nm or greater and is more preferably 50 nm or greater.

In the example shown in FIG. 20, each pixel P includes the red sub pixel R, the green sub pixel G and the blue sub pixel B. Alternatively, as in a display device 200A shown in FIG. 26, the plurality of sub pixels included in each pixel P may include the yellow sub pixel Ye in addition to the red sub pixel R, the green sub pixel G and the blue sub pixel B. The yellow light emitting element 1y provided in an area corresponding to the yellow sub pixel Ye preferably emit yellow light having a dominant wavelength of 550 nm or greater and 600 nm or less.

Figure 26:
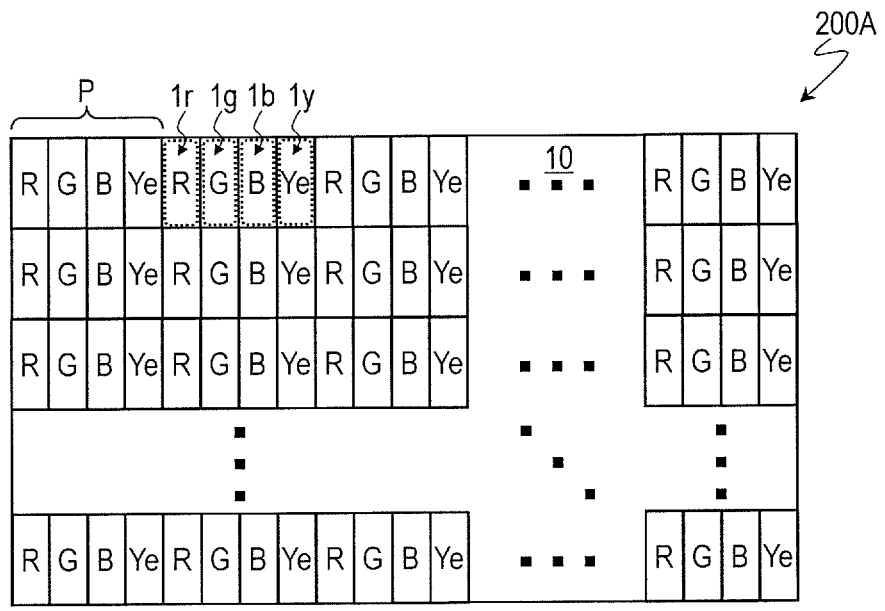
FIG. 26 is a plan view schematically showing a display device 200A in an embodiment according to the present invention.

In the case where the structure shown in FIG. 26 is adopted, light is emitted in a wavelength range in which the individual difference on X(λ) and Y(λ) is large (550 nm to 600 nm) in addition to a wavelength range in which the individual difference on Z(λ) is large (400 nm to 500 nm). Therefore, the variance in a color perceived by viewers is further alleviated.

In this embodiment, the spectrum of the blue light is broadened as described above. Alternatively, the color variance caused by the individual difference on the color-matching functions is considered to be alleviated by broadening the spectrum of the red light or the green light. However, when the spectrum of the red light or the green light is broadened, the color reproduction range is narrowed as described below.

Figure 27:
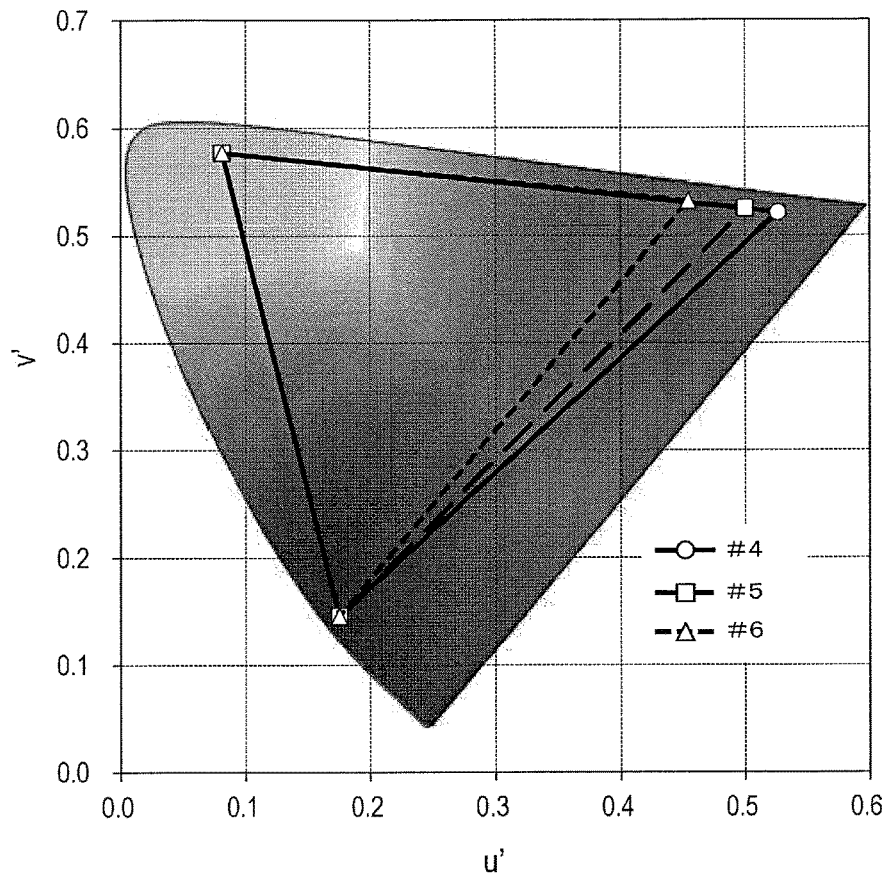
FIG. 27 is a u′v′ chromaticity diagram showing color reproduction ranges in three cases of #4, #5 and #6.
Figure 28:
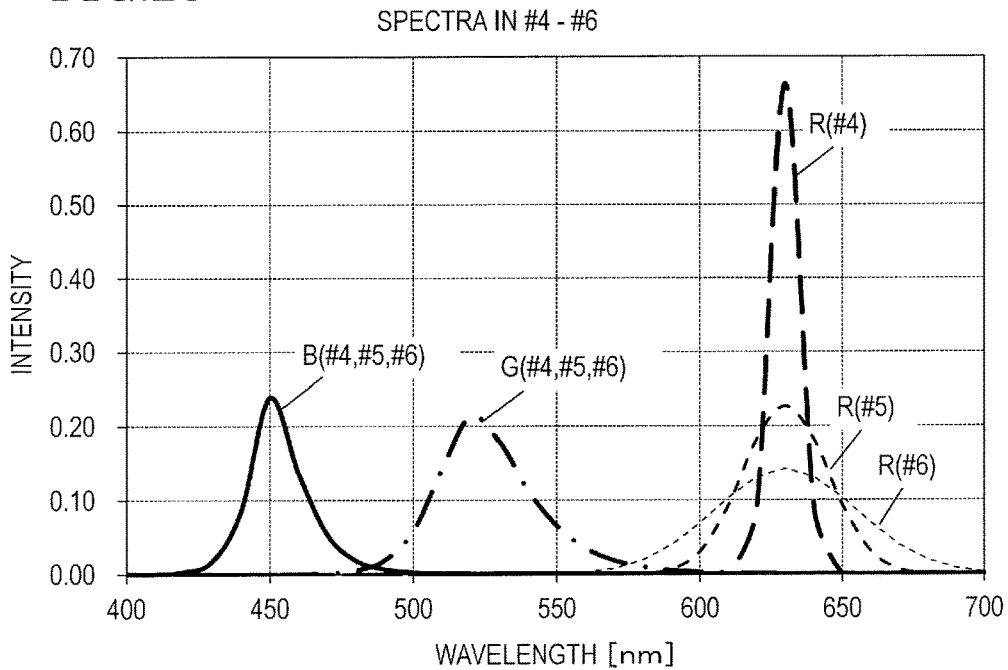
FIG. 28 is a graph showing spectra of red, green and blue in the three cases of #4, #5 and #6.

Table 6 below shows the results of calculation of individual difference ΔE in three cases of different spectrum half widths of red (#4, #5 and #6). FIG. 27 shows color reproduction ranges in the three cases of #4, #5 and #6. #4 is the case where the spectrum half width of red 20 nm, #5 is the case where the spectrum half width of red is 40 nm, and #6 is the case where the spectrum half width of red is 80 nm. The spectra of red in #4, #5 and #6 are shown in FIG. 28.

TABLE 6

|  | #4 | #5 | #6 |
| --- | --- | --- | --- |
| Half width (R) | 20 nm | 40 nm | 80 nm |
| Individual difference ΔE (average) | 1.41 | 1.22 | 1.07 |

As can be seen from Table 6, the average individual difference ΔE is 1.41 in #4, whereas the average individual difference ΔE is 1.22 in #5 and is 1.07 in #6. As can be seen, as the spectrum half width of red is broader, the individual difference ΔE is smaller.

However, as can be seen from FIG. 27, the color reproduction range in #5 is narrow than the color reproduction range in #4, and the color reproduction range in #6 is still narrower. Namely, as the spectrum half width of red is broader, the color reproduction range is narrower.

Figure 29:
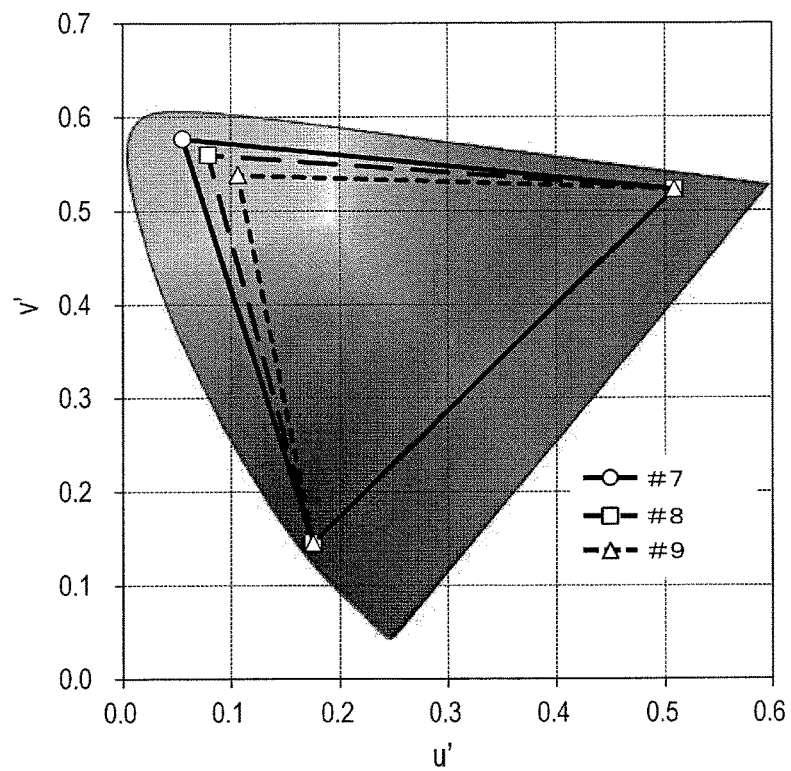
FIG. 29 is a u′v′ chromaticity diagram showing color reproduction ranges in the three cases of #7, #8 and #9.
Figure 30:
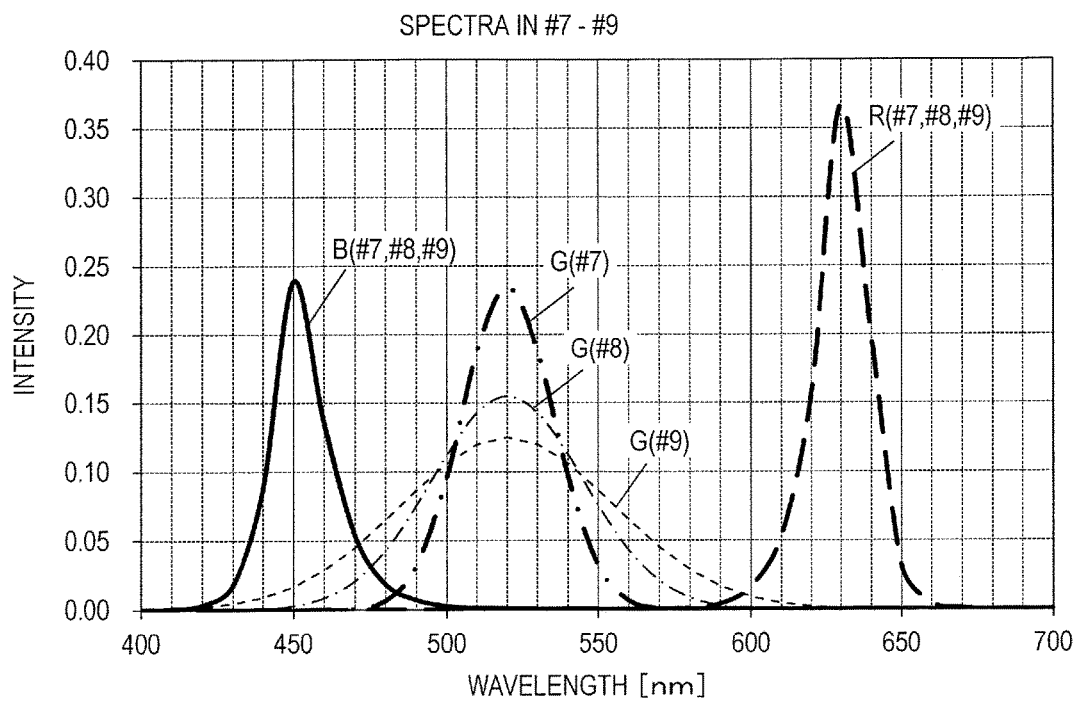
FIG. 30 is a graph showing spectra of red, green and blue in the three cases of #7, #8 and #9.

Table 7 below shows the results of calculation of individual difference ΔE in three cases of different spectrum half widths of green (#7, #8 and #9). FIG. 29 shows color reproduction ranges in the three cases of #7, #8 and #9. #7 is the case where the spectrum half width of green 40 nm, #8 is the case where the spectrum half width of green is 60 nm, and #9 is the case where the spectrum half width of green is 80 nm. The spectra of green in #7, #8 and #9 are shown in FIG. 30.

TABLE 7

|  | #7 | #8 | #9 |
| --- | --- | --- | --- |
| Half width (G) | 40 nm | 60 nm | 80 nm |
| Individual difference ΔE (average) | 1.52 | 1.34 | 1.18 |

As can be seen from Table 7, the average individual difference ΔE is 1.52 in #7, whereas the average individual difference ΔE is 1.34 in #8 and is 1.18 in #9. As can be seen, as the spectrum half width of green is broader, the individual difference ΔE is smaller.

However, as can be seen from FIG. 29, the color reproduction range in #8 is narrow than the color reproduction range in #7, and the color reproduction range in #9 is still narrower. Namely, as the spectrum half width of green is broader, the color reproduction range is narrower.

As can be seen from the above, when the spectrum of the red light or the green light is broadened, the color variance caused by the individual difference on the color-matching functions is alleviated, but the color reproduction range is narrowed.

By contrast, in this embodiment in which the spectrum of the blue light is broadened in the wavelength range of 525 nm or less (or in embodiment 1 in which the yellow sub pixel Ye (yellow light emitting element 1y) is provided), the color variance caused by the individual difference on the color-matching functions is alleviated without narrowing the color reproduction range.

(Embodiment 3)

Figure 31:
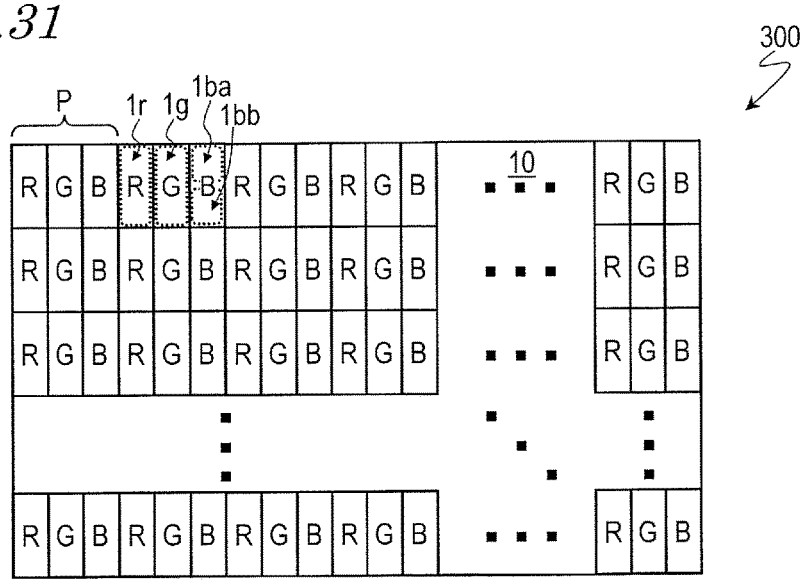
FIG. 31 is a plan view schematically showing a display device 300 in an embodiment according to the present invention.

FIG. 31 shows a display device 300 in this embodiment. FIG. 31 is a plan view schematically showing the display device 300.

As shown in FIG. 31, the display device 300 includes a spontaneous light emission-type display panel 10. The display device 200 includes a plurality of pixels P.

The plurality of pixels P are arrayed in a matrix including rows and columns. The plurality of pixels P each include a red sub pixel R, a green sub pixel G and a blue sub pixel B. Namely, the plurality of sub pixels included in each pixel P do not include a yellow sub pixel.

The display panel 10 includes a red light emitting element 1r emitting red light, a green light emitting element 1g emitting green light, a first blue light emitting element 1ba and a second blue light emitting element 1bb. The first blue light emitting element 1ba and the second blue light emitting element 1bb emit blue light of different spectra from each other.

The red light emitting element 1r is provided in an area corresponding to the red sub pixel R in the display panel 10, and the green light emitting element 1g is provided in an area corresponding to the green sub pixel G in the display panel 10. Both of the first blue light emitting element 1ba and the second blue light emitting element 1bb are provided in an area corresponding to the blue sub pixel B in the display panel 10. Namely, the two blue light emitting elements 1ba and 1bb are provided in correspondence with one blue sub pixel B.

The red light emitting element 1r, the green light emitting element 1g, the first blue light emitting element 1ba and the second blue light emitting element 1bb are each, for example, an organic EL element. Needless to say, each of the red light emitting element 1r, the green light emitting element 1g, the first blue light emitting element 1ba and the second blue light emitting element 1bb is not limited to being an organic EL element, and may be any of various known spontaneous light emission-type elements (e.g., inorganic EL element).

Figure 32:
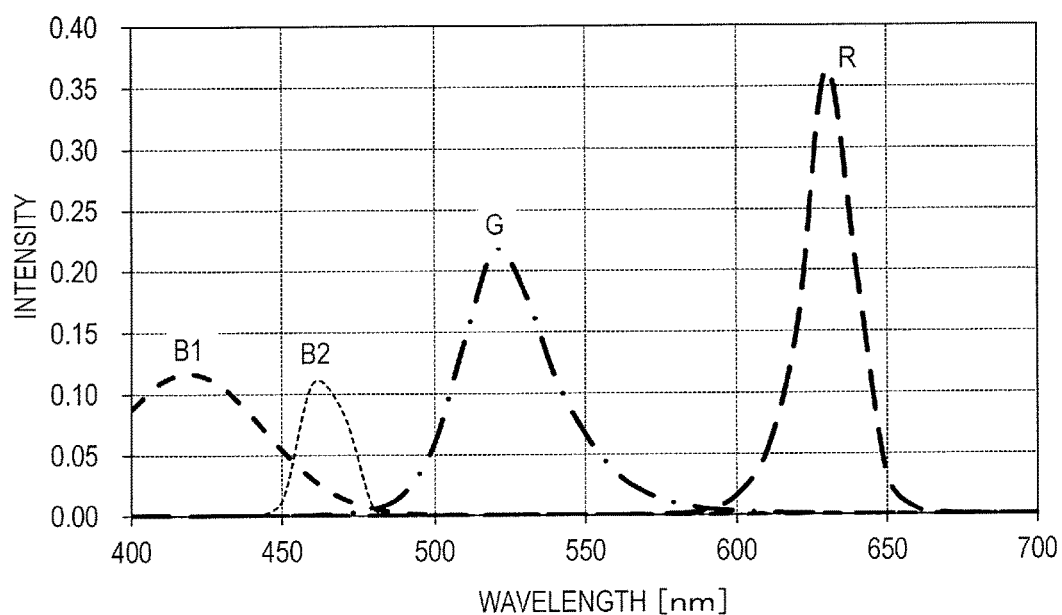
FIG. 32 is a graph showing spectra of red light, green light and blue light respectively emitted by the red light emitting element 1r, the green light emitting element 1g and first and second blue light emitting elements 1ba and 1bb in the display device 300.

FIG. 32 shows spectra of red light, green light and blue light respectively emitted by the red light emitting element 1r, the green light emitting element 1g and the first and second blue light emitting elements 1ba and 1bb. As shown in FIG. 32, the spectrum of the blue light emitted by the first blue light emitting element 1ba ("B1" in FIG. 32), and the spectrum of the blue light emitted by the second blue light emitting element 1bb ("B2" in FIG. 32), are different from each other. In the example shown in FIG. 32, the blue light emitted by the first blue light emitting element 1ba has a dominant wavelength of 419 nm, and the blue light emitted by the second blue light emitting element 1bb has a dominant wavelength of 464 nm. Neither the blue light emitted by the first blue light emitting element 1ba nor the blue light emitted by the second blue light emitting element 1bb substantially includes a component having a wavelength exceeding 525 nm.

In the display device 300 in this embodiment, the display panel 10 includes the first blue light emitting element 1ba and the second blue light emitting element 1bb, which emit the blue light of different spectra as described above. Therefore, the blue light is emitted so as to cover a broad wavelength range in which the individual difference on the color-matching functions is large (400 nm to 500 nm). For this reason, the variance in a color perceived by viewers is alleviated.

In the case where two types of blue light emitting elements (first blue light emitting element 1ba and second blue light emitting element 1bb) are provided, blue as one of the primary colors is created by color mixture of the blue light emitted by the first blue light emitting element 1ba and the blue light emitted by the second blue light emitting element 1bb. In the case where the light emission spectra of the first blue light emitting element 1ba and the second blue light emitting element 1bb are appropriately set, the influence on the color reproduction range is substantially eliminated without changing the chromaticity of blue almost at all. Therefore, the display device 300 in this embodiment alleviates the color variance caused by the individual difference on the color-matching functions without narrowing the color reproduction range.

Figure 33:
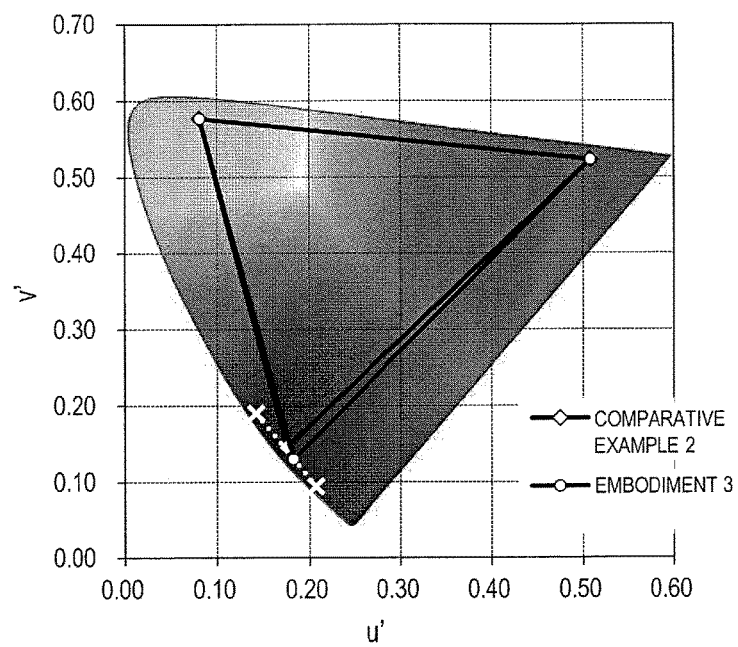
FIG. 33 is a u'v' chromaticity diagram showing color reproduction ranges of the display device in comparative example 2 and the display device 300.
Figure 34:
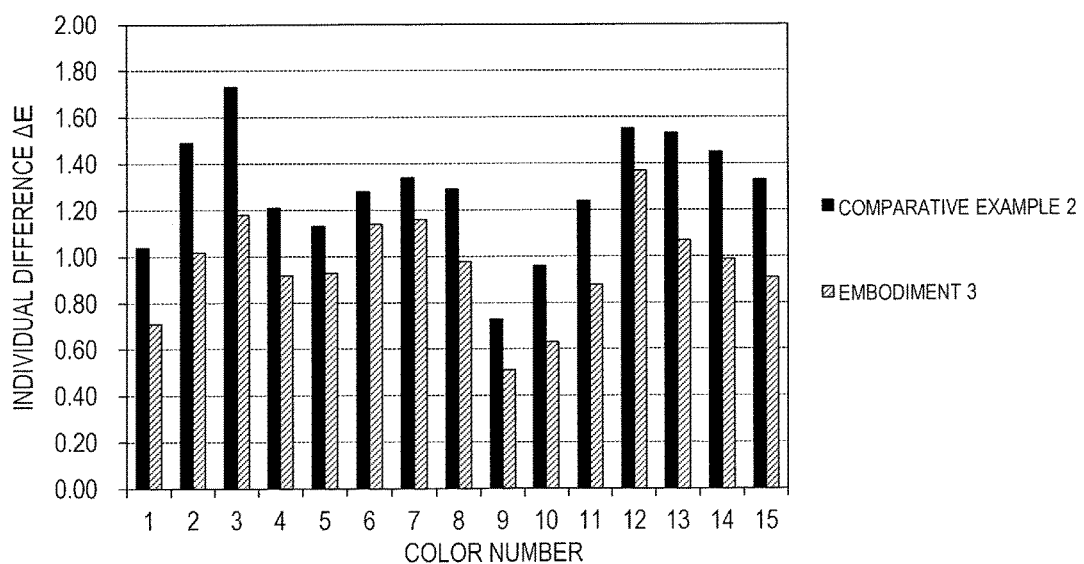
FIG. 34 is a graph showing results of calculation of individual difference ΔE in the display device in comparative example 2 and the display device 300.

FIG. 33 shows color reproduction ranges of the display device in comparative example 2 (referred to in embodiment 2) and the display device 300 in this embodiment. Table 8 below and FIG. 34 show results of calculation of individual difference ΔE in the display device in comparative example 2 and the display device 300 in this embodiment.

TABLE 8

| Color No. | Individual difference ΔE | |
|---|---|---|
| | Comparative example 2 | Embodiment 3 |
| 1 | 1.04 | 0.78 |
| 2 | 1.49 | 1.10 |
| 3 | 1.73 | 1.29 |
| 4 | 1.21 | 0.96 |
| 5 | 1.13 | 0.92 |
| 6 | 1.28 | 1.12 |
| 7 | 1.34 | 1.13 |
| 8 | 1.29 | 0.98 |
| 9 | 0.73 | 0.53 |
| 10 | 0.96 | 0.70 |
| 11 | 1.24 | 0.92 |
| 12 | 1.55 | 1.21 |
| 13 | 1.53 | 1.16 |
| 14 | 1.45 | 1.11 |
| 15 | 1.33 | 1.01 |
| Average | 1.29 | 0.99 |

As can be seen from FIG. 33, the display device in comparative example 2 and the display device 300 in this embodiment have substantially the same color reproduction range. As can be seen from Table 8 and FIG. 34, the individual difference ΔE for the 15 colors and the average individual difference ΔE are both smaller in the display device 300 in this embodiment than in the display device in comparative example 2.

As described above, the display device 300 in this embodiment alleviates the color variance caused by the individual difference on the color-matching functions without narrowing the color reproduction range.

From the point of view of alleviating the color variance caused by the individual difference on the color-matching functions more certainly, it is preferable that the blue light emitted by the first blue light emitting element 1ba has a dominant wavelength of 400 nm or greater and 450 nm or less and the blue light emitted by the second blue light emitting element 1bb has a dominant wavelength of 450 nm or greater and 515 nm or less.

As described above with reference to Table 1, as the spectrum half width of each of the three primary colors is narrower, the individual difference ΔE is larger. Specifically, when the spectrum half width of each of the three primary colors is 30 nm or less, the average individual difference ΔE is 1.50 or larger. When the spectrum half width of each of the three primary colors is 10 nm or less, the average individual difference ΔE is 2.00 or larger. Therefore, the effect realized by providing the two types of blue light emitting elements 1ba and 1bb (the effect that the color variance caused by the individual difference on the color-matching functions is alleviated) is considered to be improved as the spectrum half width of each of red and green is narrower. More specifically, the above-described effect is considered to be high when the spectrum half width of each of the red light and the green light respectively emitted by the red light emitting element 1r and the green light emitting element 1g is 30 nm or less, and is considered to be still higher when the spectrum half width of each of the red light and the green light is 10 nm or less.

In the example shown in FIG. 31, each pixel P includes the red sub pixel R, the green sub pixel G and the blue sub pixel B. Alternatively, as in a display device 300A shown in FIG. 35, the plurality of sub pixels included in each pixel P may include the yellow sub pixel Ye in addition to the red sub pixel R, the green sub pixel G and the blue sub pixel B. The yellow light emitting element 1y provided in an area corresponding to the yellow sub pixel Ye preferably emit yellow light having a dominant wavelength of 550 nm or greater and 600 nm or less.

Figure 35:
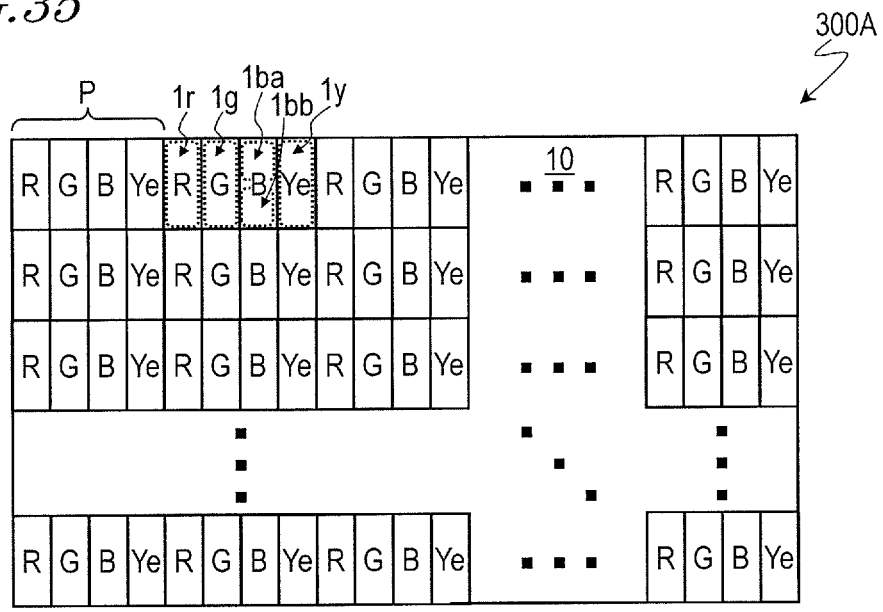
FIG. 35 is a plan view schematically showing a display device 300A in an embodiment according to the present invention.

In the case where the structure shown in FIG. 35 is adopted, light is emitted in a wavelength range in which the individual difference on X(λ) and Y(λ) is large (550 nm to 600 nm) in addition to a wavelength range in which the individual difference on Z(λ) is large (400 nm to 500 nm). Therefore, the variance in a color perceived by viewers is further alleviated.

Figure 36:
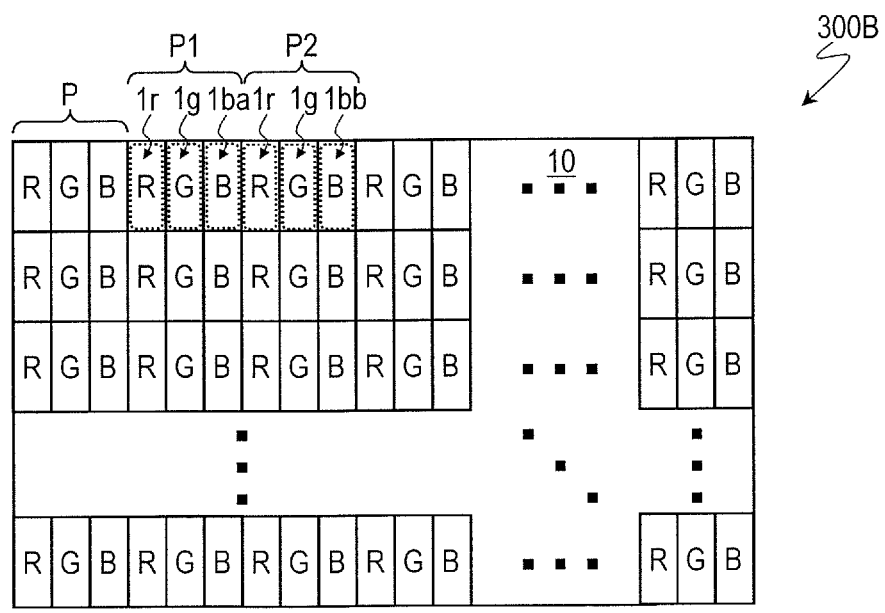
FIG. 36 is a plan view schematically showing a display device 300B in an embodiment according to the present invention.

In the example shown in FIG. 31, both of the first blue light emitting element 1ba and the second blue light emitting element 1bb are provided in the area corresponding to the blue sub pixel B in the display panel 10. It is not absolutely necessary that the first blue light emitting element 1ba and the second blue light emitting element 1bb are provided in correspondence with one blue sub pixel B. As in a display device 300B shown in FIG. 36, the plurality of pixels P may include a pixel P1 in which the first blue light emitting element 1ba is provided but the second blue light emitting element 1bb is not provided in the area corresponding to the blue sub pixel B in the display panel 10, and a pixel P2 in which the second blue light emitting element 1bb is provided but the first blue light emitting element 1ba is not provided in the area corresponding to the blue sub pixel B in the display panel 10. Namely, a pixel including only one of the first blue light emitting element 1ba and the second blue light emitting element 1bb, and a pixel including only the other thereof, may be both included. The pixel P1 including only the first blue light emitting element 1ba as the blue light emitting element is preferably adjacent to the pixel P2 including only the second blue light emitting element 1bb as the blue light emitting element, in at least one of the row direction and the column direction.

In the case where the structure shown in FIG. 31 including the two (two types of) blue light emitting elements 1ba and 1bb in correspondence with one blue sub pixel B is adopted, an advantage that the pixel structure is simple and thus is realized at low cost is provided. Meanwhile, in the case where the structure shown in FIG. 36 including a pixel that includes only one of the first light emitting element 1ba and the second blue light emitting element 1bb and a pixel that includes only the other thereof is adopted, the chromaticity point of each pixel is driven independently. This provides an advantage that the color range is broadened.

(Embodiment 4)

Figure 37:
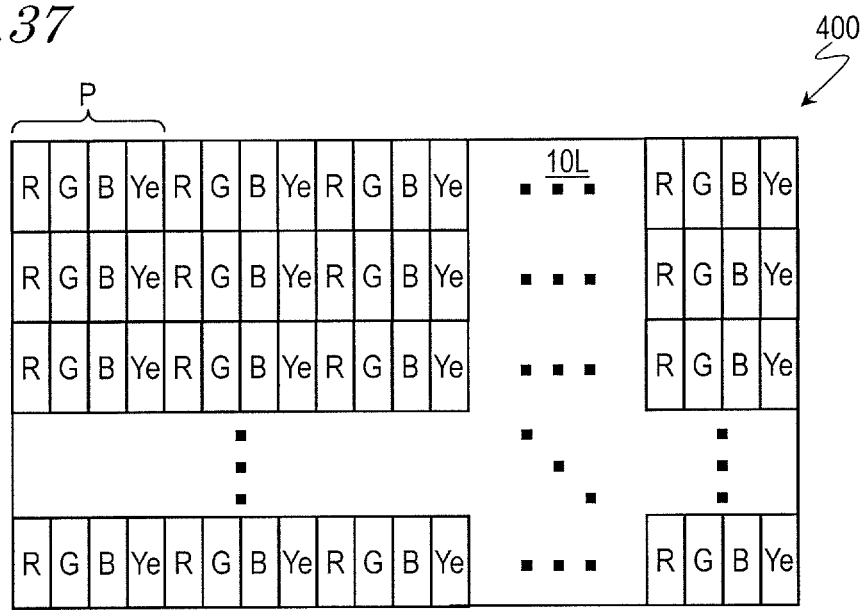
FIG. 37 is a plan view schematically showing a display device 400 in an embodiment according to the present invention.
Figure 38:
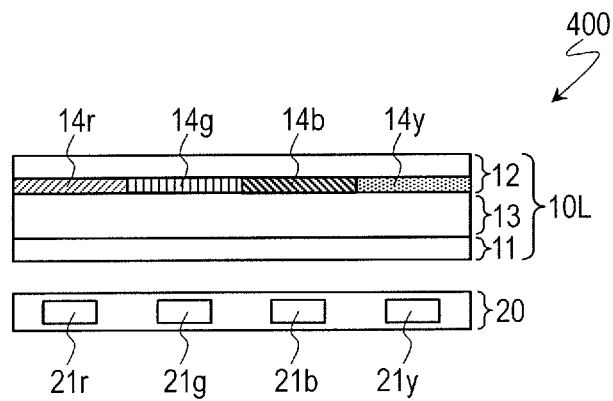
FIG. 38 is a cross-sectional view schematically showing the display device 400.

FIG. 37 and FIG. 38 show a display device 400 in this embodiment. FIG. 37 is a plan view schematically showing the display device 400. FIG. 38 is a cross-sectional view schematically showing the display device 400.

As shown in FIG. 37 and FIG. 38, the display device 400 includes a liquid crystal display panel 10L and an illumination device (backlight) 20 irradiating the liquid crystal display panel 10L with light. The display device 400 includes a plurality of pixels P.

The liquid crystal display panel 10L includes a first substrate (active matrix substrate) 11 provided on a rear side (illumination device 20 side), a second substrate (counter substrate) 12 provided on the side of a viewer, and a liquid crystal layer 13 provided between the first substrate 11 and the second substrate 12.

The plurality of pixels P are arrayed in a matrix including rows and columns. The plurality of pixels P each include a red sub pixel R, a green sub pixel G, a blue sub pixel B and a yellow sub pixel Ye.

The first substrate 11 and the second substrate 12 of the liquid crystal panel 10L each include an electrode, an alignment film and the like (not shown). The second substrate 12 further includes a red color filter 14r, a green color filter 14g, a blue color filter 14b and a yellow color filter 14y respectively provided in correspondence with the red sub pixel R, the green sub pixel G, the blue sub pixel B and the yellow sub pixel Ye.

The illumination device 20 includes a red light source 21r emitting red light, a green light source 21g emitting green light, and a blue light source 21b emitting blue light. The illumination device 20 further includes a yellow light source 21y emitting yellow light. The red light source 21r, the green light source 21g, the blue light source 21b and the yellow light source 21y are each, for example, a light emitting diode (LED). Needless to say, the red light source 21r, the green light source 21g, the blue light source 21b and the yellow light source 21y may each be any of various known light sources.

Figure 39:
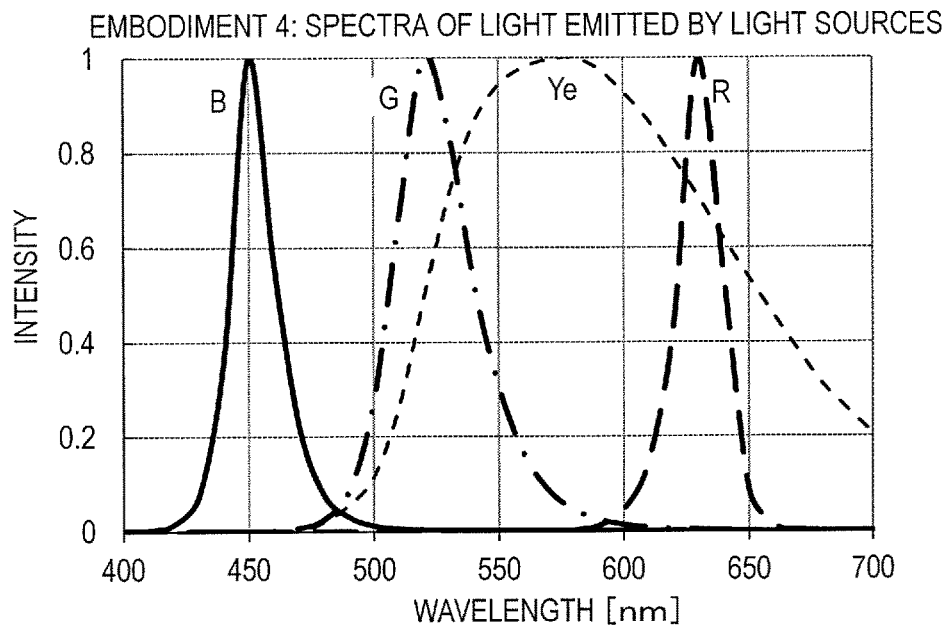
FIG. 39 is a graph showing spectra of red light, green light, blue light and yellow light respectively emitted by a red light source 21r, a green light source 21g, a blue light source 21b and a yellow light source 21y in the display device 400.

FIG. 39 shows spectra of the red light, the green light, the blue light and the yellow light respectively emitted by the red light source 21r, the green light source 21g, the blue light source 21b and the yellow light source 21y. As can be seen from FIG. 39, the yellow light emitted by the yellow light source 21y has a dominant wavelength of 550 nm or greater and 600 nm or less.

Figure 40:
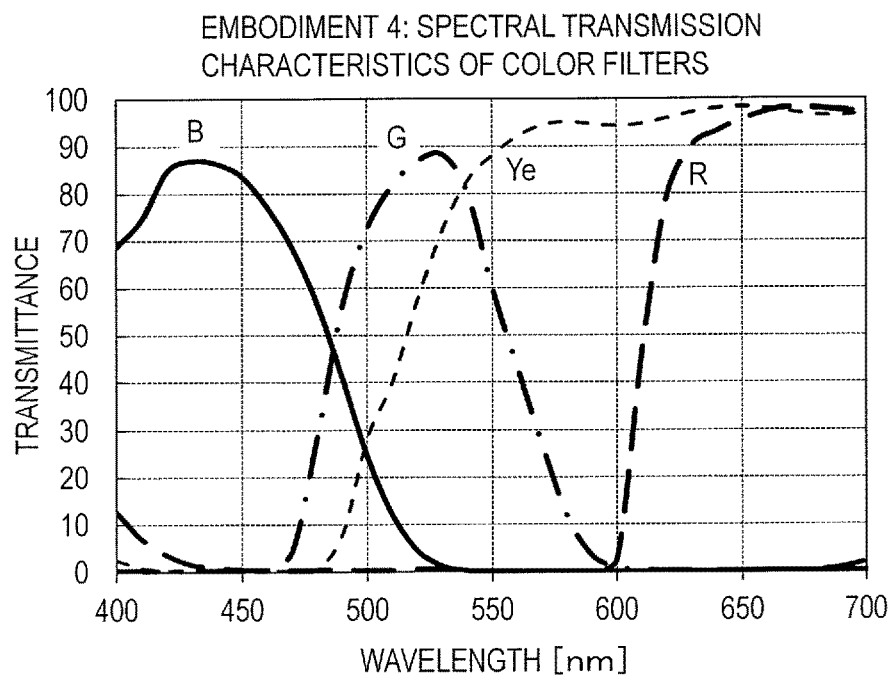
FIG. 40 is a graph showing spectral transmission characteristics of a red color filter 14r, a green color filter 14g, a blue color filter 14b and a yellow color filter 14y in the display device 400.
Figure 41:
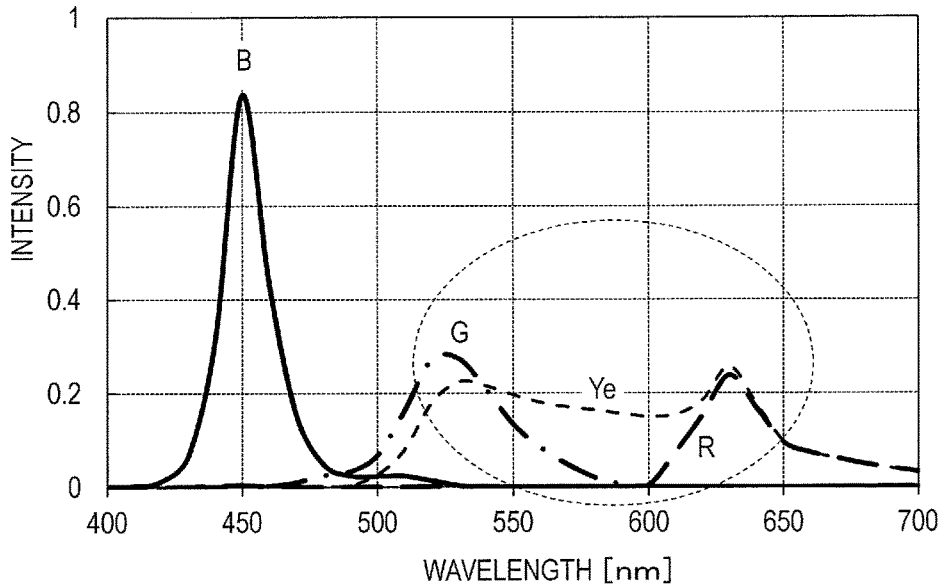
FIG. 41 is a graph showing spectra of red, green, blue and yellow displayed by a red sub pixel R, a green sub pixel G, a blue sub pixel B and a yellow sub pixel Ye (i.e., primary colors used for display) in the display device 400.

The red color filter 14r, the green color filter 14g, the blue color filter 14b and the yellow color filter 14y have spectral transmission characteristics shown in FIG. 40. Red, green, blue and yellow displayed by the red sub pixel R, the green sub pixel G, the blue sub pixel B and the yellow sub pixel Ye (i.e., primary colors used for display) have spectra shown in FIG. 41.

In the display device 400 in this embodiment, the illumination device 20 includes the yellow light source 21y emitting yellow light having a dominant wavelength of 550 nm or greater and 600 nm or less. Therefore, as can be seen from FIG. 41, the yellow light is emitted in a wavelength range in which the individual difference on the color-matching functions is large (550 nm or greater and 600 nm or less). For this reason, the variance in a color perceived by viewers is alleviated.

Figure 42:
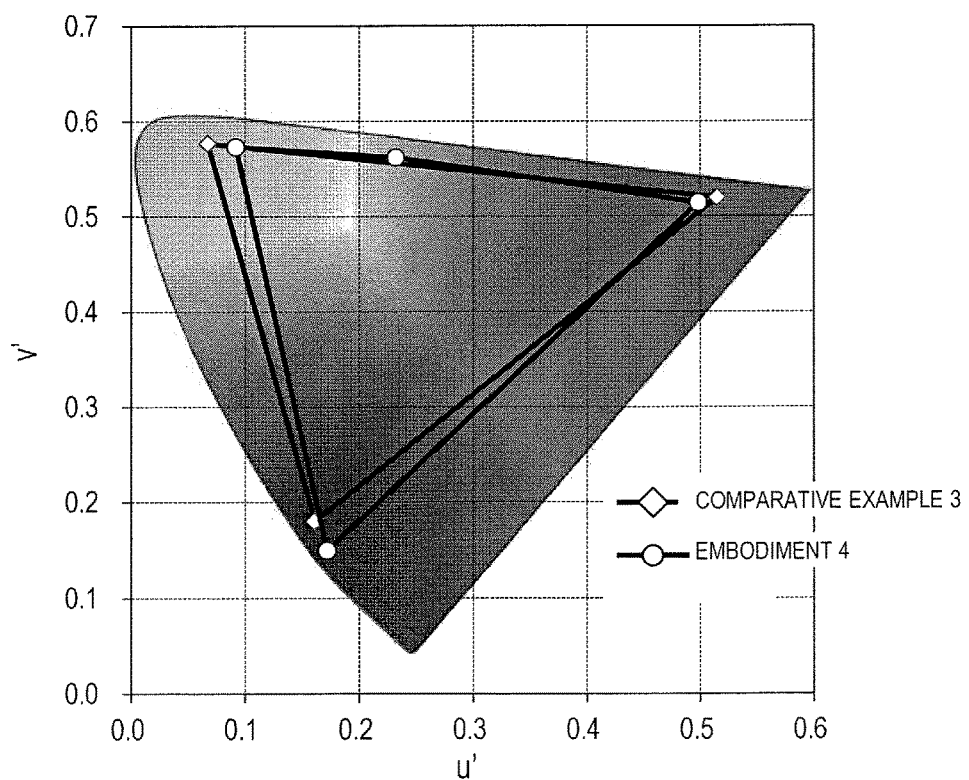
FIG. 42 is a u'v' chromaticity diagram showing color reproduction ranges of a display device in comparative example 3 and the display device 400.
Figure 43:
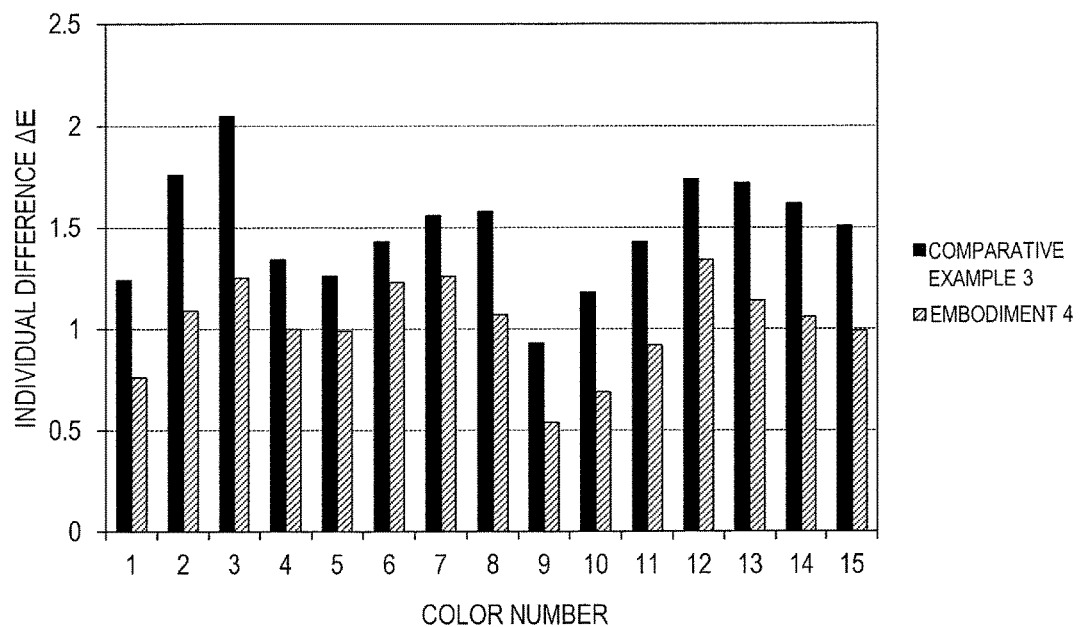
FIG. 43 is a graph showing results of calculation of individual difference ΔE in the display device in comparative example 3 and the display device 400.
Figure 44:
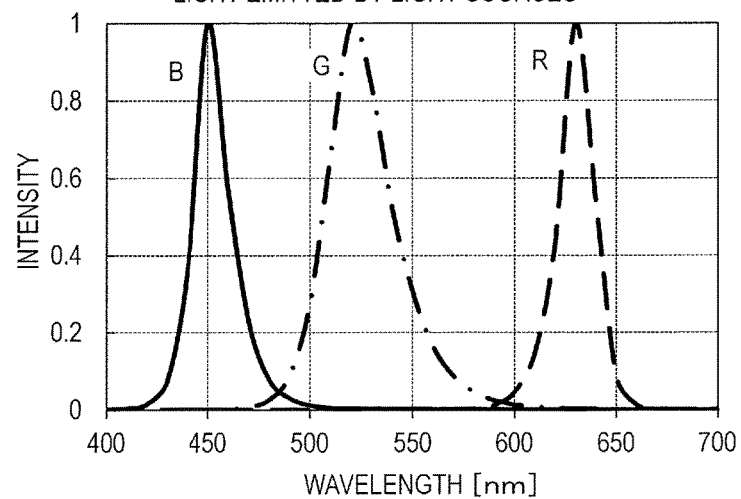
FIG. 44 is a graph showing spectra of red light, green light and blue light respectively emitted by a red light source, a green light source and a blue light source in the display device in comparative example 3.
Figure 45:
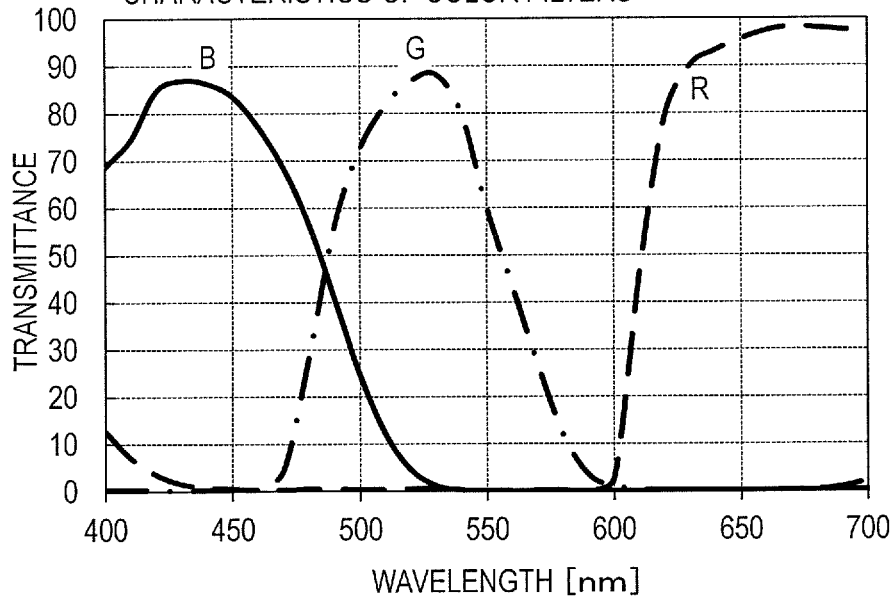
FIG. 45 is a graph showing spectral transmission characteristics of a red color filter, a green color filter and a blue color filter in the display device in comparative example 3.
Figure 46:
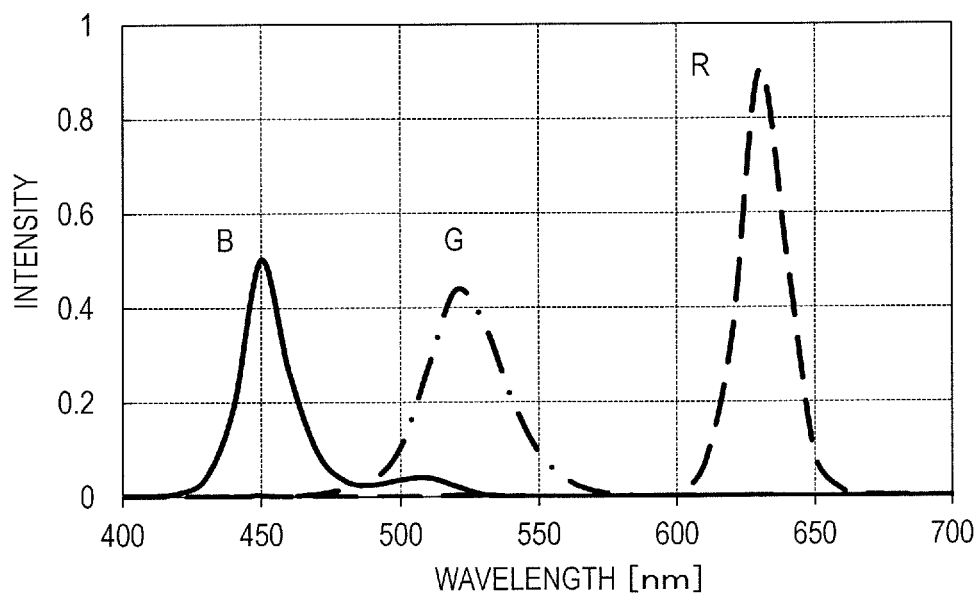
FIG. 46 is a graph showing spectra of red, green and blue displayed by a red sub pixel, a green sub pixel and a blue sub pixel (i.e., primary colors used for display) in the display device in comparative example 3.

FIG. 42 shows color reproduction ranges of a display device in comparative example 3 and the display device 400 in this embodiment. Table 9 below and FIG. 43 show results of calculation of individual difference ΔE in the display device in comparative example 3 and the display device 400 in this embodiment. The display device in comparative example 3 includes a liquid crystal display panel and an illumination device. In the display device in comparative example 3, each of pixels includes a red sub pixel, a green pixel and a blue sub pixel. The illumination device includes a red light source, a green light source and a blue light source. The liquid crystal display panel includes a red color filter, a green color filter and a blue color filter. In the display device in comparative example 3, red light, green light and blue light respectively emitted by the red light source, the green light source and the blue light source have spectra shown in FIG. 44. The red color filter, the green color filter and the blue color filter have spectral transmission characteristics shown in FIG. 45. Red, green and blue displayed by the red sub pixel, the green sub pixel and the blue sub pixel (i.e., primary colors used for display) have spectra shown in FIG. 46.

TABLE 9

| Color No. | Individual difference ΔE | |
| --- | --- | --- |
| | Comparative example 3 | Embodiment 4 |
| 1 | 1.24 | 0.76 |
| 2 | 1.76 | 1.09 |
| 3 | 2.05 | 1.25 |
| 4 | 1.34 | 1.00 |
| 5 | 1.26 | 0.99 |
| 6 | 1.43 | 1.23 |
| 7 | 1.56 | 1.26 |
| 8 | 1.58 | 1.07 |
| 9 | 0.93 | 0.54 |
| 10 | 1.18 | 0.69 |
| 11 | 1.43 | 0.92 |
| 12 | 1.74 | 1.34 |
| 13 | 1.72 | 1.14 |
| 14 | 1.62 | 1.06 |
| 15 | 1.51 | 0.99 |
| Average | 1.49 | 1.02 |
| Maximum | 2.05 | 1.34 |

As can be seen from FIG. 42, the display device in comparative example 3 and the display device 400 in this embodiment have almost the same color reproduction range although the chromaticities of the primary colors are slightly different. As can be seen from Table 9 and FIG. 43, the individual difference ΔE for the 15 colors, the average individual difference ΔE, and the maximum individual difference ΔE are all smaller in the display device 400 in this embodiment than in the display device in comparative example 3.

As described above, the display device 400 in this embodiment alleviates the color variance caused by the individual difference on the color-matching functions without decreasing the color reproduction performance.

In this embodiment, each pixel P includes four sub pixels (red sub pixel R, green sub pixel G, blue sub pixel B and yellow sub pixel Ye). Alternatively, each pixel P may include five or more sub pixels. For example, the plurality of sub pixels included in each pixel P may include a cyan sub pixel in addition to the red sub pixel R, the green sub pixel G, the blue sub pixel B and the yellow sub pixel Ye. In this case, the liquid crystal display panel 10L includes a cyan color filter corresponding to the cyan sub pixel.

This specification discloses a display device described in the following items.

[Item 1]
A display device, comprising:
a spontaneous light emission-type display panel;
the display device including a plurality of pixels;
wherein:
the plurality of pixels each include a plurality of sub pixels including a red sub pixel, a green sub pixel and a blue sub pixel;
the display panel includes a red light emitting element provided in an area corresponding to the red sub pixel, a green light emitting element provided in an area corresponding to the green sub pixel, and a blue light emitting element provided in an area corresponding to the blue sub pixel;
red light, green light and blue light respectively emitted by the red light emitting element, the green light emitting element and the blue light emitting element each have a spectrum half width of 10 nm or less;
the plurality of sub pixels further include a yellow sub pixel; and
the display panel further includes a yellow light emitting element provided in an area corresponding to the yellow sub pixel, the yellow light emitting element emitting yellow light having a dominant wavelength of 550 nm or greater and 600 nm or less.

The display device according to item 1 alleviates variance in a color perceived by viewers, which is caused by individual difference on color-matching functions.

[Item 2]
The display device according to item 1, wherein yellow displayed by the yellow sub pixel has a chromaticity on a side of, or on the inside of, a triangle having, as apexes, chromaticities of red, green and blue displayed by the red sub pixel, the green sub pixel and the blue sub pixel on a chromaticity diagram.

[Item 3]
A display device, comprising:
a spontaneous light emission-type display panel;
the display device including a plurality of pixels;
wherein:
the plurality of pixels each include a plurality of sub pixels including a red sub pixel, a green sub pixel and a blue sub pixel;
the display panel includes a red light emitting element provided in an area corresponding to the red sub pixel, a green light emitting element provided in an area corresponding to the green sub pixel, and a blue light emitting element provided in an area corresponding to the blue sub pixel; and
blue light emitted by the blue light emitting element does not substantially include a component having a wavelength exceeding 525 nm and has a spectrum half width exceeding 20 nm.

The display device according to item 3 alleviates variance in a color perceived by viewers, which is caused by individual difference on color-matching functions.

[Item 4]
A display device, comprising:
a spontaneous light emission-type display panel;
the display device including a plurality of pixels;
wherein the display panel includes a red light emitting element emitting red light, a green light emitting element emitting green light, and a first blue light emitting element and a second blue light emitting element emitting blue light of different spectra from each other.

The display device according to item 4 alleviates variance in a color perceived by viewers, which is caused by individual difference on color-matching functions.

[Item 5]
The display device according to item 4, wherein:
the plurality of pixels each include a plurality of sub pixels including a red sub pixel, a green sub pixel and a blue sub pixel; and
the first blue light emitting element and the second blue light emitting element are provided in an area corresponding to the blue sub pixel in the display panel.

[Item 6]
The display device according to item 4, wherein:
the plurality of pixels each include a plurality of sub pixels including a red sub pixel, a green sub pixel and a blue sub pixel; and
the plurality of pixels include a pixel in which the first blue light emitting element is provided but the second blue light emitting element is not provided in an area corresponding to the blue sub pixel in the display panel, and also include a pixel in which the second blue light emitting element is provided but the first blue light emitting element is not provided in the area corresponding to the blue sub pixel in the display panel.

[Item 7]

The display device according to any one of items 3, 5 and 6, wherein:

the plurality of sub pixels further include a yellow sub pixel; and the display panel further includes a yellow light emitting element provided in an area corresponding to the yellow sub pixel, the yellow light emitting element emitting yellow light having a dominant wavelength of 550 nm or greater and 600 nm or less.

[Item 8]

The display device according to any one of items 3 through 7, wherein red light and green light respectively emitted by the red light emitting element and the green light emitting element each have a spectrum half width of 30 nm or less.

[Item 9]

The display device according to any one of items 3 through 7, wherein red light and green light respectively emitted by the red light emitting element and the green light emitting element each have a spectrum half width of 10 nm or less.

[Item 10]

A display device, comprising:

a liquid crystal display panel including a liquid crystal layer; and an illumination device irradiating the liquid crystal display panel with light;

the display device including a plurality of pixels; wherein:

the illumination device includes a red light source emitting red light, a green light source emitting green light, and a blue light source emitting blue light;

the plurality of pixels each include a plurality of sub pixels including a red sub pixel, a green sub pixel, a blue sub pixel and a yellow sub pixel; and the illumination device further includes a yellow light source emitting yellow light having a dominant wavelength of 550 nm or greater and 600 nm or less.

The display device according to item 10 alleviates variance in a color perceived by viewers, which is caused by individual difference on color-matching functions.

INDUSTRIAL APPLICABILITY

The embodiments of the present invention provide a display device in which variance in a color perceived by viewers, which is caused by individual difference on color-matching functions, is alleviated.

REFERENCE SIGNS LIST

1*r* Red light emitting element
1*g* Green light emitting element
1*b* Blue light emitting element
1*ba* First blue light emitting element
1*bb* Second blue light emitting element
1*y* Yellow light emitting element
10 Display panel
10L Liquid crystal display panel
11 First substrate (active matrix substrate)
12 Second substrate (counter substrate)
13 Liquid crystal layer
14*r* Red color filter
14*g* Green color filter
14*b* Blue color filter
14*y* Yellow color filter
20 Illumination device (backlight)
21*r* Red light source
21*g* Green light source
21*b* Blue light source
21*y* Yellow light source
100, 200, 200A, 300, 300A, 300B, 400 Display device
P, P1, P2 Pixel
R Red sub pixel
G Green sub pixel
B Blue sub pixel
Ye Yellow sub pixel

The invention claimed is:

1. A display device, comprising:

a spontaneous light emission-type display panel;

the display device including a plurality of pixels; wherein:

the plurality of pixels each include a plurality of sub pixels including a red sub pixel, a green sub pixel, and a blue sub pixel;

the display panel includes a red light emitting element provided in an area corresponding to the red sub pixel, a green light emitting element provided in an area corresponding to the green sub pixel, and a blue light emitting element provided in an area corresponding to the blue sub pixel;

red light, green light, and blue light respectively emitted by the red light emitting element, the green light emitting element, and the blue light emitting element each have a spectrum half width of 10 nm or less;

the plurality of sub pixels further include a yellow sub pixel;

the display panel further includes a yellow light emitting element provided in an area corresponding to the yellow sub pixel, the yellow light emitting element emitting yellow light having a dominant wavelength of 550 nm or greater and 600 nm or less; and yellow displayed by the yellow sub pixel has a chromaticity on a side of, or inside of, a triangle having, as apexes, chromaticities of red, green, and blue displayed by the red sub pixel, the green sub pixel, and the blue sub pixel on a chromaticity diagram.

2. The display device according to claim 1, wherein a spectrum half width of the yellow light is wider than spectrum half widths of the red light, the green light, and the blue light.

3. The display device according to claim 2, wherein the spectrum half width of the yellow light is 20 nm or more.

* * * * *